US012568812B2

(12) United States Patent
Kao et al.

(10) Patent No.: US 12,568,812 B2
(45) Date of Patent: Mar. 3, 2026

(54) BACK-END-OF-LINE CMOS INVERTER HAVING TWIN CHANNELS AND ONE GATE ELECTRODE AND METHODS OF FORMING THE SAME

(71) Applicant: Taiwan Semiconductor Manufacturing Company Limited, Hsinchu (TW)

(72) Inventors: Yun-Feng Kao, New Taipei (TW); Katherine H. Chiang, New Taipei (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 407 days.

(21) Appl. No.: 18/302,960

(22) Filed: Apr. 19, 2023

(65) Prior Publication Data

US 2024/0355726 A1 Oct. 24, 2024

(51) Int. Cl.
*H01L 23/522* (2006.01)
*H01L 21/768* (2006.01)
*H01L 23/528* (2006.01)

(52) U.S. Cl.
CPC .... *H01L 23/5226* (2013.01); *H01L 21/76843* (2013.01); *H01L 21/76879* (2013.01); *H01L 23/5286* (2013.01)

(58) Field of Classification Search
CPC ............. H01L 23/5226; H01L 23/5286; H01L 21/76843; H01L 21/76879

(Continued)

(56) References Cited

U.S. PATENT DOCUMENTS 11,189,525 B2 * 11/2021 Wang ................ H01L 21/76816
2017/0352598 A1 12/2017 Lee
(Continued)

FOREIGN PATENT DOCUMENTS

TW          I566362  B       1/2017
TW          202137499 A      10/2021

OTHER PUBLICATIONS

TW Jianq Chyun Intellectual Property Office; TW Application No. 112122276; Office Action mailed Jan. 25, 2024; 8 pages.

*Primary Examiner* — Tu-Tu V Ho
(74) *Attorney, Agent, or Firm* — The Marbury Law Group, PLLC

(57) ABSTRACT

An embodiment inverter circuit includes a first-conductivity-type semiconductor layer disposed over an interlayer dielectric layer, a gate electrode disposed over the first-conductivity-type semiconductor layer, a second-conductivity-type semiconductor layer disposed over the gate electrode, a first gate dielectric layer disposed between the first-conductivity-type semiconductor layer and the gate electrode, a second gate dielectric layer disposed between the gate electrode and the second-conductivity-type semiconductor layer, a first source electrode that is in contact with the first-conductivity-type semiconductor layer, a second source electrode that is in contact with the second-conductivity-type semiconductor layer, and a shared drain electrode that is in contact with the first-conductivity-type semiconductor layer and the second-conductivity-type semiconductor layer. At least one of the first-conductivity-type layer and the second-conductivity-type layer includes a metal-oxide semiconductor and/or a multi-layer structure formed in a BEOL process that may be incorporated with other BEOL circuit components such as capacitors, inductors, resistors, and integrated passive devices.

20 Claims, 24 Drawing Sheets

(58) Field of Classification Search
USPC ........................................................ 257/777
See application file for complete search history.

(56)                    References Cited

U.S. PATENT DOCUMENTS

| 2019/0214304 | A1 | 7/2019 | Hussain |
| 2021/0343715 | A1 | 11/2021 | Wu et al. |
| 2022/0393033 | A1 | 12/2022 | Van Dal et al. |

* cited by examiner

200

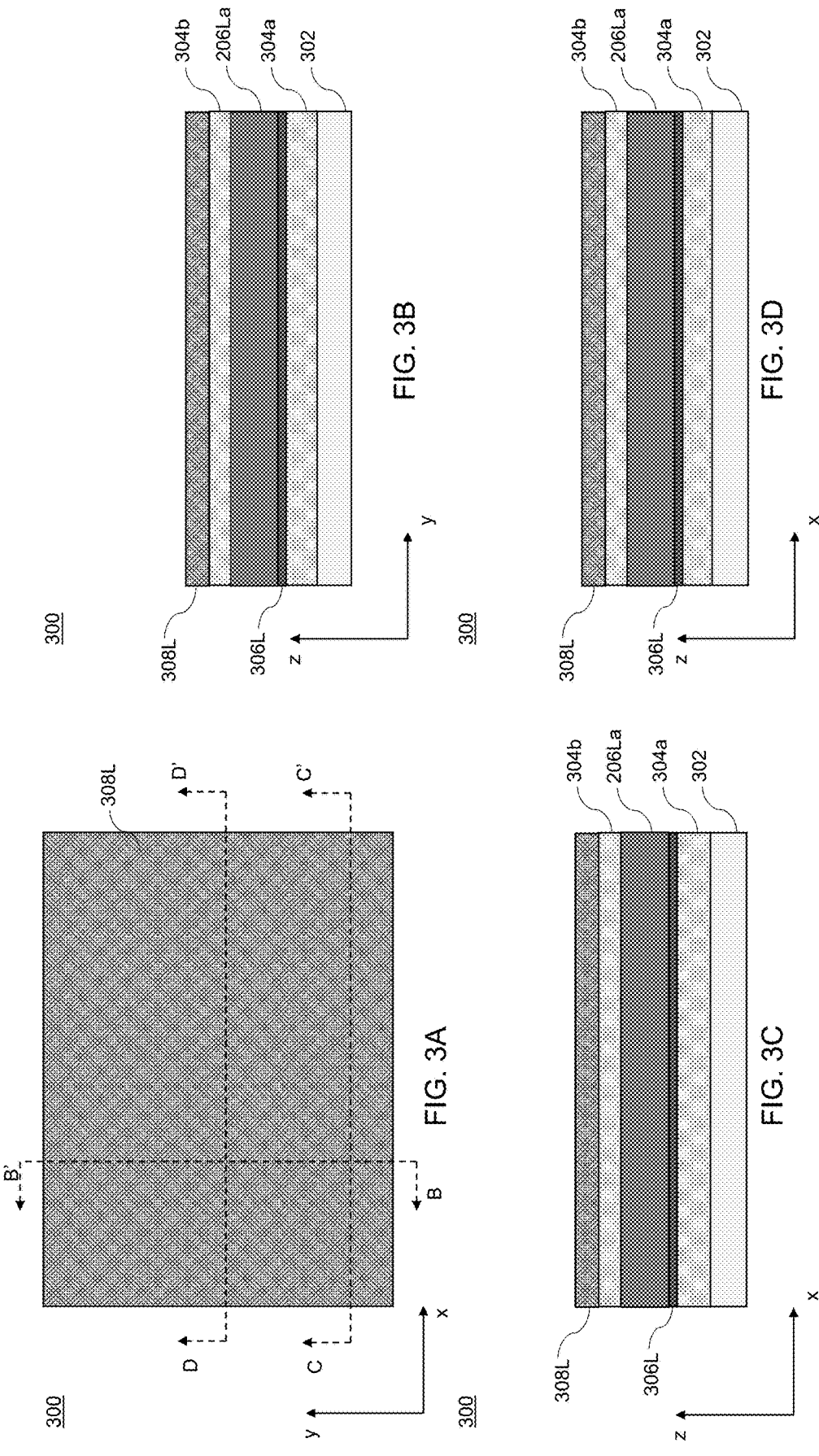

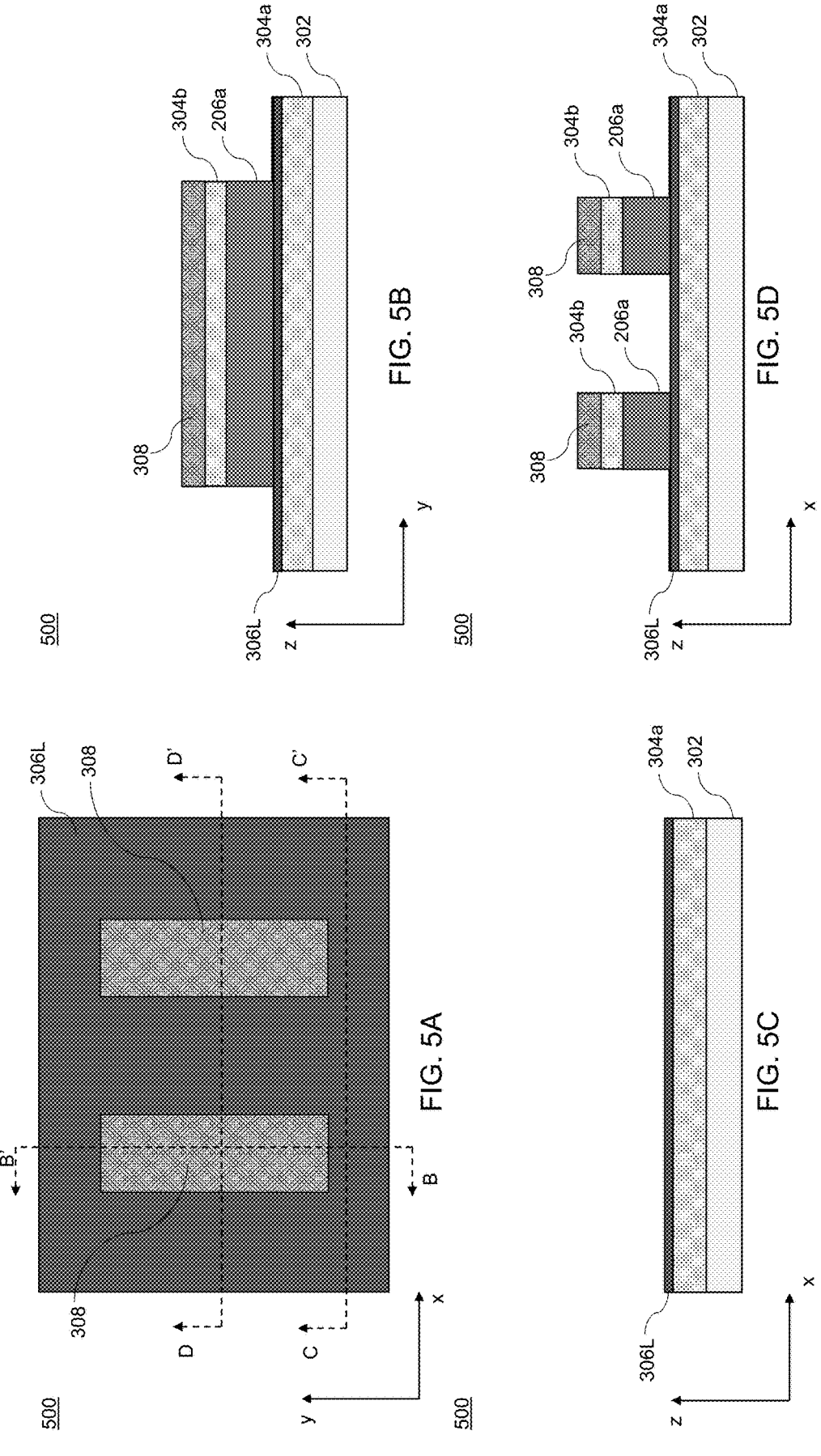

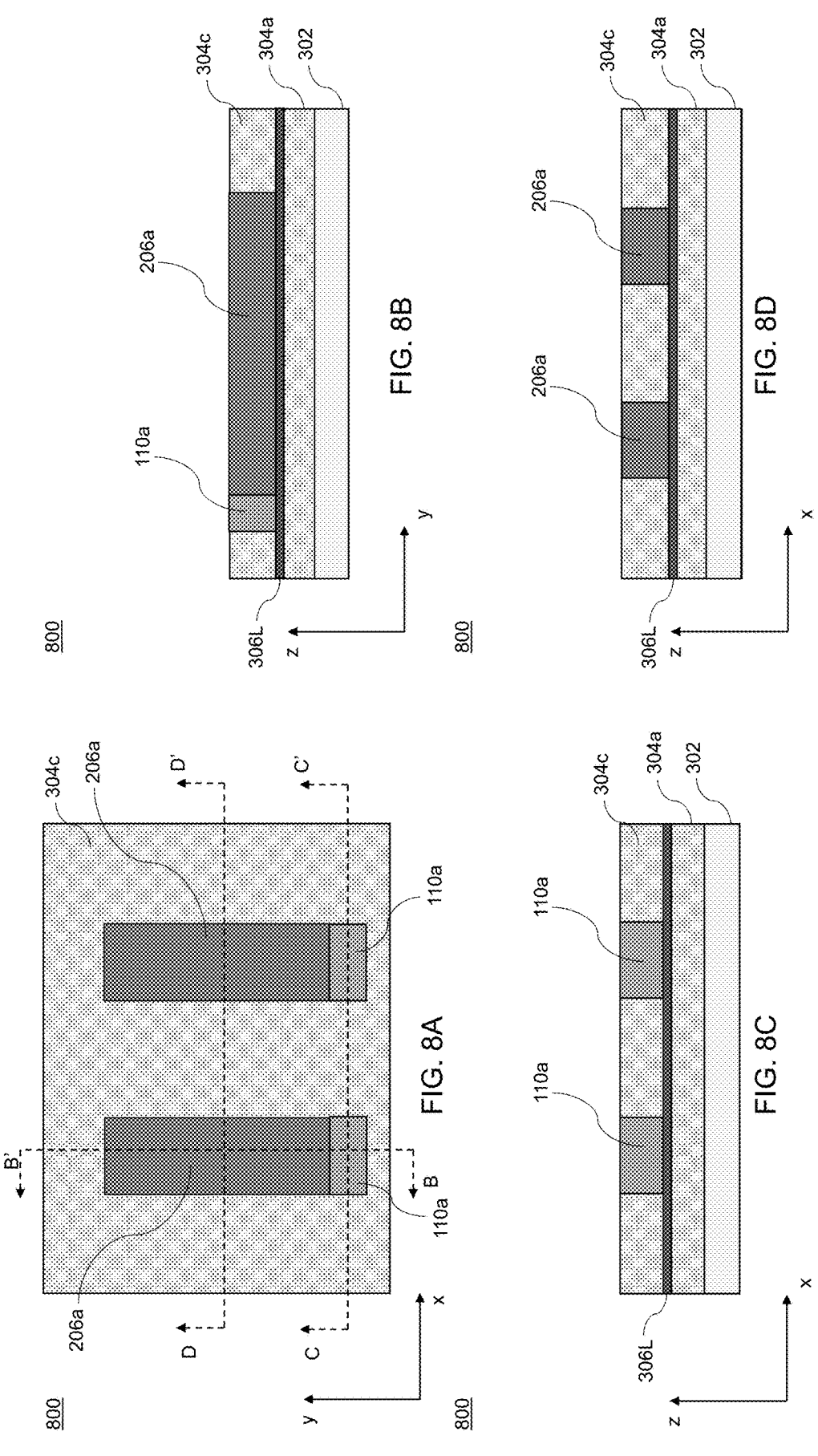

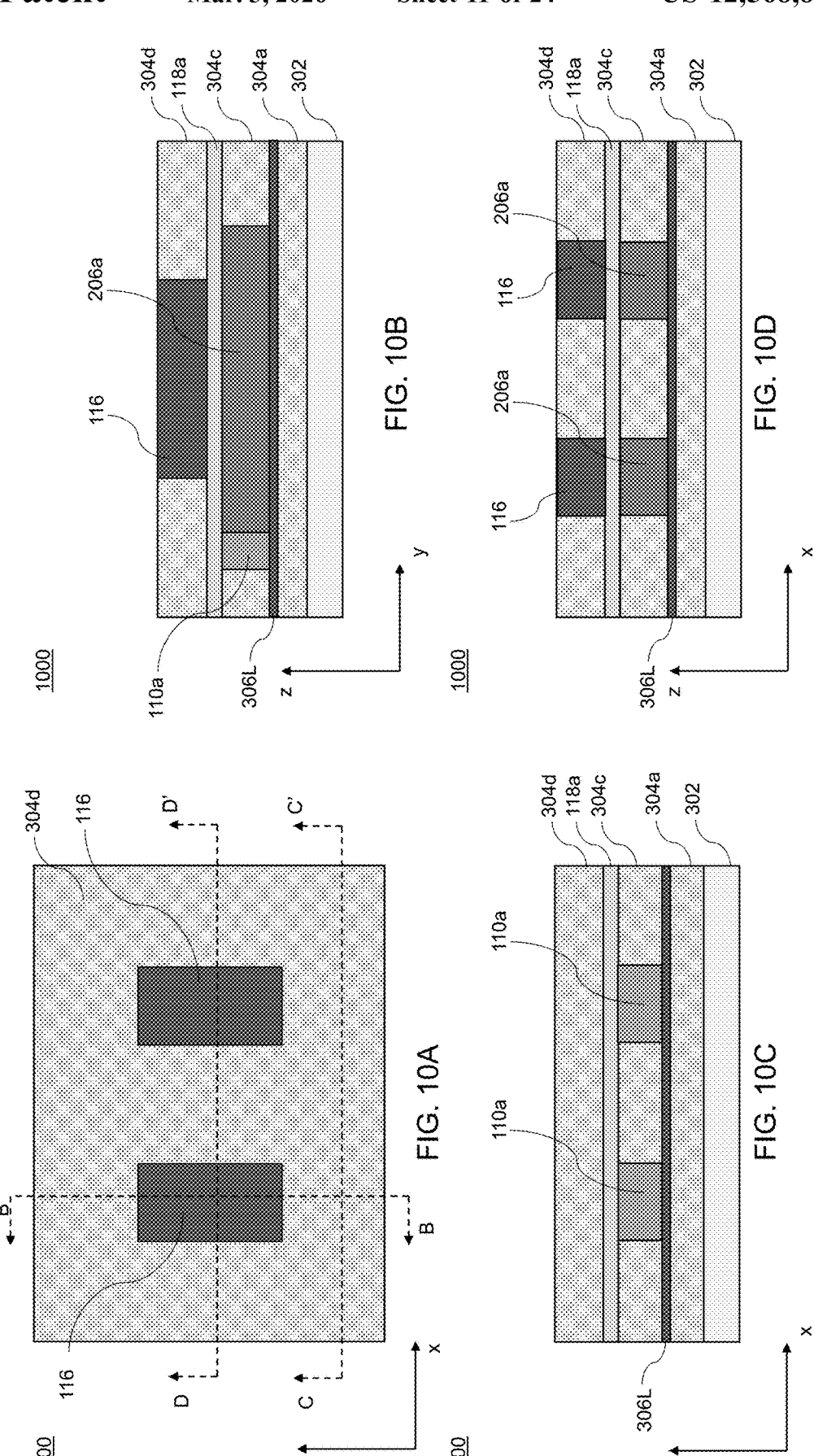

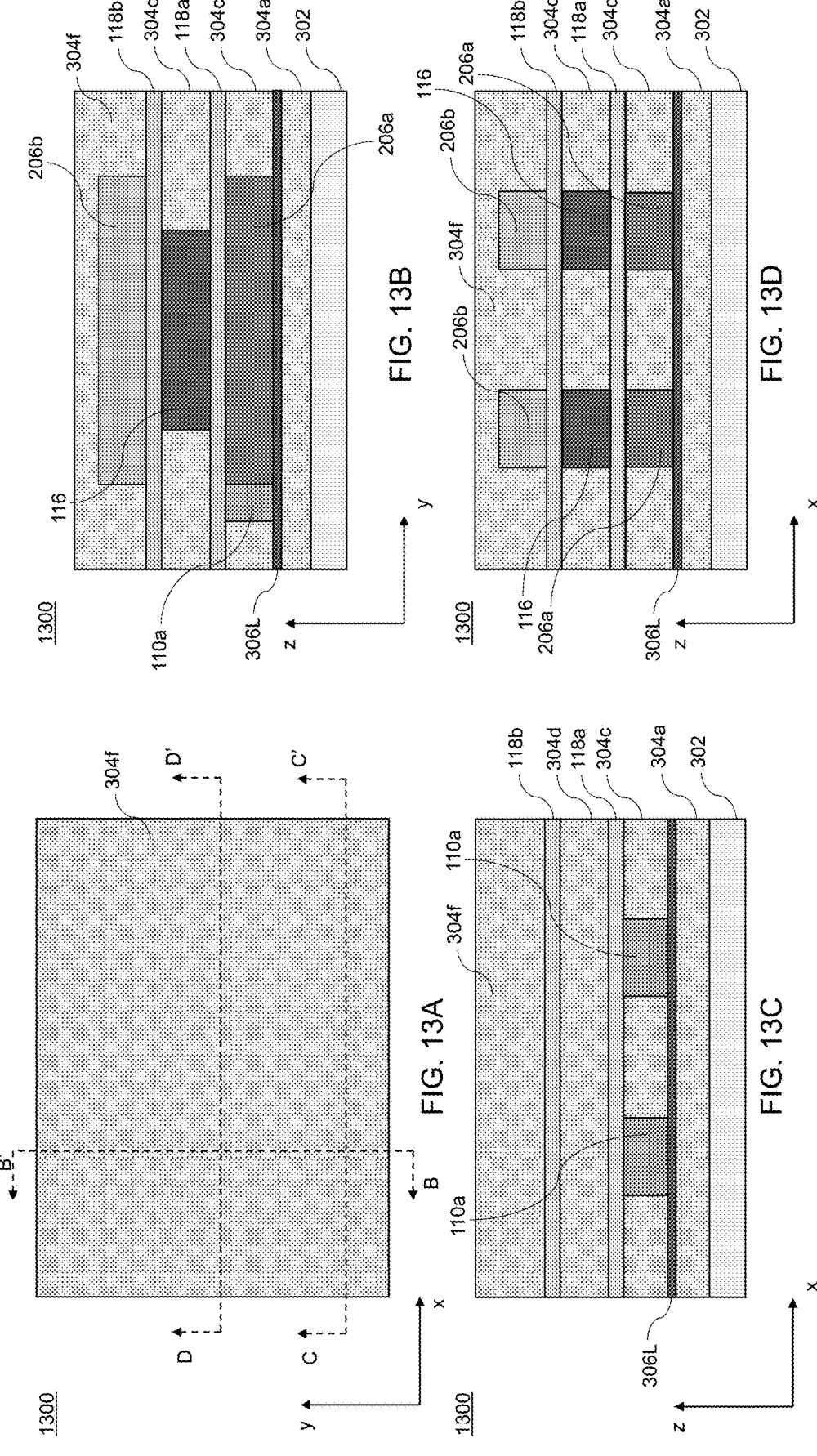

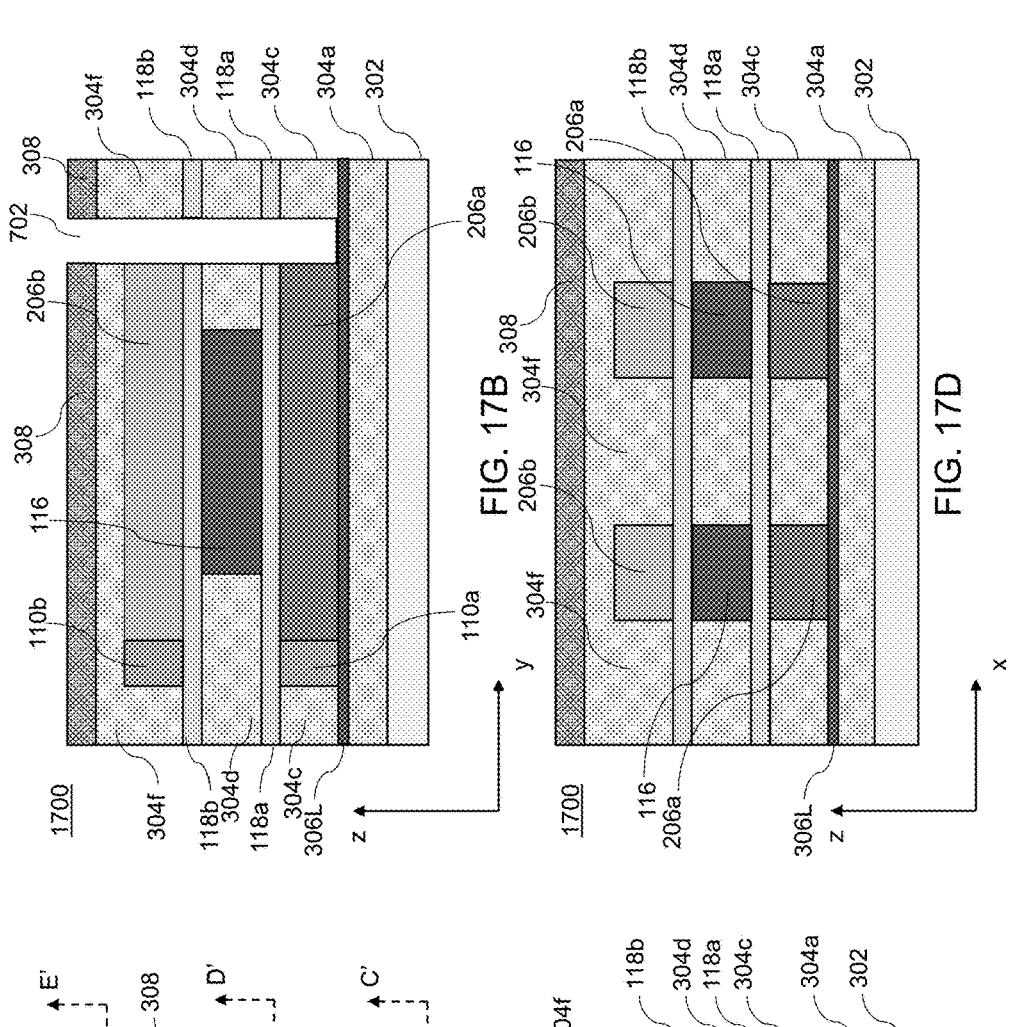
FIG. 17A
FIG. 17B
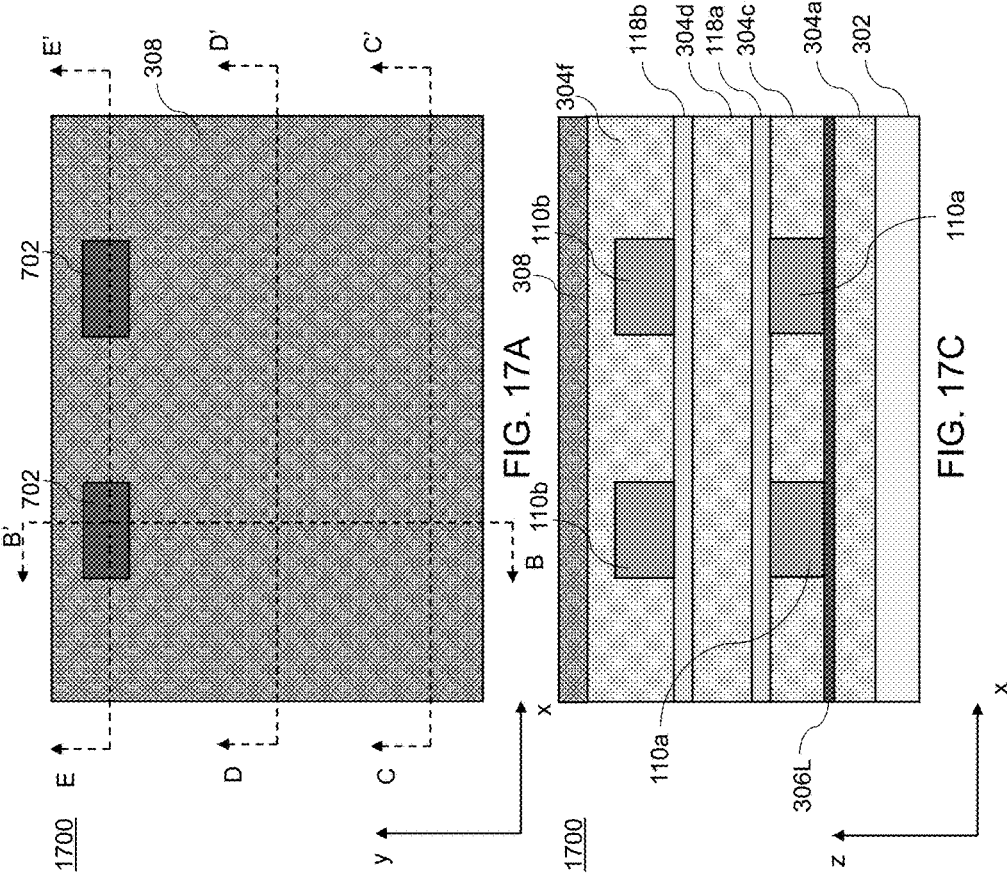
FIG. 17C
FIG. 17D

200

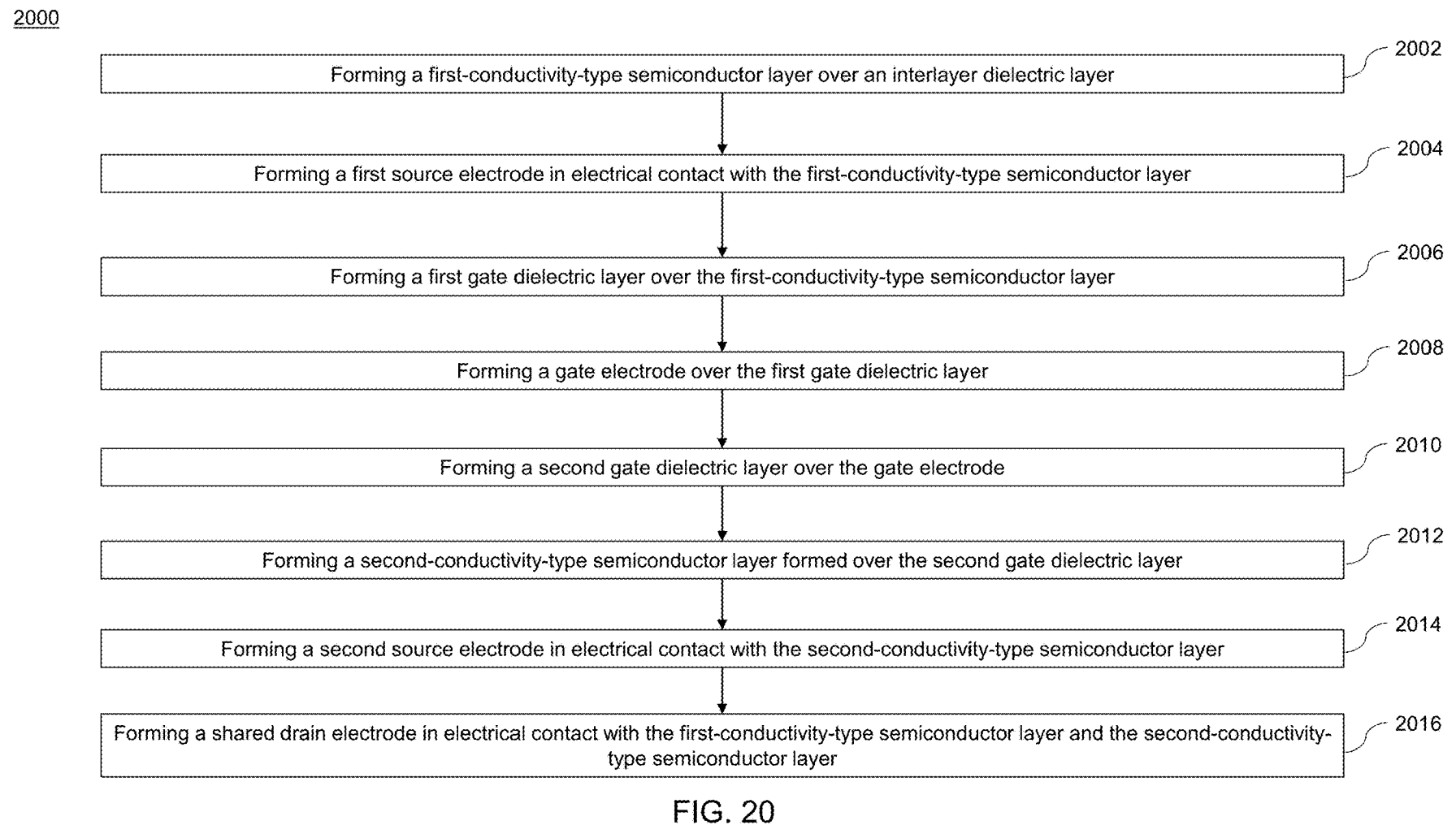

2000

2002 Forming a first-conductivity-type semiconductor layer over an interlayer dielectric layer 2004 Forming a first source electrode in electrical contact with the first-conductivity-type semiconductor layer 2006 Forming a first gate dielectric layer over the first-conductivity-type semiconductor layer 2008 Forming a gate electrode over the first gate dielectric layer 2010 Forming a second gate dielectric layer over the gate electrode 2012 Forming a second-conductivity-type semiconductor layer formed over the second gate dielectric layer 2014 Forming a second source electrode in electrical contact with the second-conductivity-type semiconductor layer 2016 Forming a shared drain electrode in electrical contact with the first-conductivity-type semiconductor layer and the second-conductivity-type semiconductor layer

FIG. 20

BACK-END-OF-LINE CMOS INVERTER HAVING TWIN CHANNELS AND ONE GATE ELECTRODE AND METHODS OF FORMING THE SAME

BACKGROUND

The semiconductor industry has grown due to continuous improvements in integration density of various electronic components (e.g., transistors, diodes, resistors, inductors, capacitors, etc.). For the most part, these improvements in integration density have come from successive reductions in minimum feature size, which allow more components to be integrated into a given area. In this regard, individual transistors, interconnects, and related structures have become increasingly smaller and there is an ongoing need to develop new materials, processes, and designs of semiconductor devices and interconnects to allow further progress.

Transistors made of oxide semiconductors are an attractive option for back-end-of-line (BEOL) integration since such transistors may be processed at low temperatures and thus, may not damage previously fabricated devices. For example, the fabrication conditions and techniques may not damage previously fabricated front-end-of-line (FEOL) and middle end-of-line (MEOL) devices. Circuits based on oxide semiconductor-based transistor devices may further include other components that may be fabricated in a BEOL process, such as capacitors, inductors, resistors, and integrated passive devices.

BRIEF DESCRIPTION OF THE DRAWINGS

Aspects of this disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A is a top view of an intermediate structure that may be used in the formation of a semiconductor circuit, according to various embodiments.

FIG. 3B is a first vertical cross-sectional view of the intermediate structure of FIG. 3A, according to various embodiments.

FIG. 3C is a second vertical cross-sectional view of the intermediate structure of FIG. 3A, according to various embodiments.

FIG. 3D is a third vertical cross-sectional view of the intermediate structure of FIG. 3A, according to various embodiments.

FIG. 5A is a top view of a further intermediate structure that may be used in the formation of a semiconductor circuit, according to various embodiments.

FIG. 5B is a first vertical cross-sectional view of the intermediate structure of FIG. 5A, according to various embodiments.

FIG. 5C is a second vertical cross-sectional view of the intermediate structure of FIG. 5A, according to various embodiments.

FIG. 5D is a third vertical cross-sectional view of the intermediate structure of FIG. 5A, according to various embodiments.

FIG. 8A is a top view of a further intermediate structure that may be used in the formation of a semiconductor circuit, according to various embodiments.

FIG. 8B is a first vertical cross-sectional view of the intermediate structure of FIG. 8A, according to various embodiments.

FIG. 8C is a second vertical cross-sectional view of the intermediate structure of FIG. 8A, according to various embodiments.

FIG. 8D is a third vertical cross-sectional view of the intermediate structure of FIG. 8A, according to various embodiments.

FIG. 10A is a top view of a further intermediate structure that may be used in the formation of a semiconductor circuit, according to various embodiments.

FIG. 10B is a first vertical cross-sectional view of the intermediate structure of FIG. 10A, according to various embodiments.

FIG. 10C is a second vertical cross-sectional view of the intermediate structure of FIG. 10A, according to various embodiments.

FIG. 10D is a third vertical cross-sectional view of the intermediate structure of FIG. 10A, according to various embodiments.

FIG. 13A is a top view of a further intermediate structure that may be used in the formation of a semiconductor circuit, according to various embodiments.

FIG. 13B is a first vertical cross-sectional view of the intermediate structure of FIG. 13A, according to various embodiments.

FIG. 13C is a second vertical cross-sectional view of the intermediate structure of FIG. 13A, according to various embodiments.

FIG. 13D is a third vertical cross-sectional view of the intermediate structure of FIG. 13A, according to various embodiments.

FIG. 17A is a top view of a further intermediate structure that may be used in the formation of a semiconductor circuit, according to various embodiments.

FIG. 17B is a first vertical cross-sectional view of the intermediate structure of FIG. 17A, according to various embodiments.

FIG. 17C is a second vertical cross-sectional view of the intermediate structure of FIG. 17A, according to various embodiments.

FIG. 17D is a third vertical cross-sectional view of the intermediate structure of FIG. 17A, according to various embodiments.

FIG. 20 is a flowchart illustrating operations of a method of forming a semiconductor circuit, according to various embodiments.

DETAILED DESCRIPTION

Figure 1:
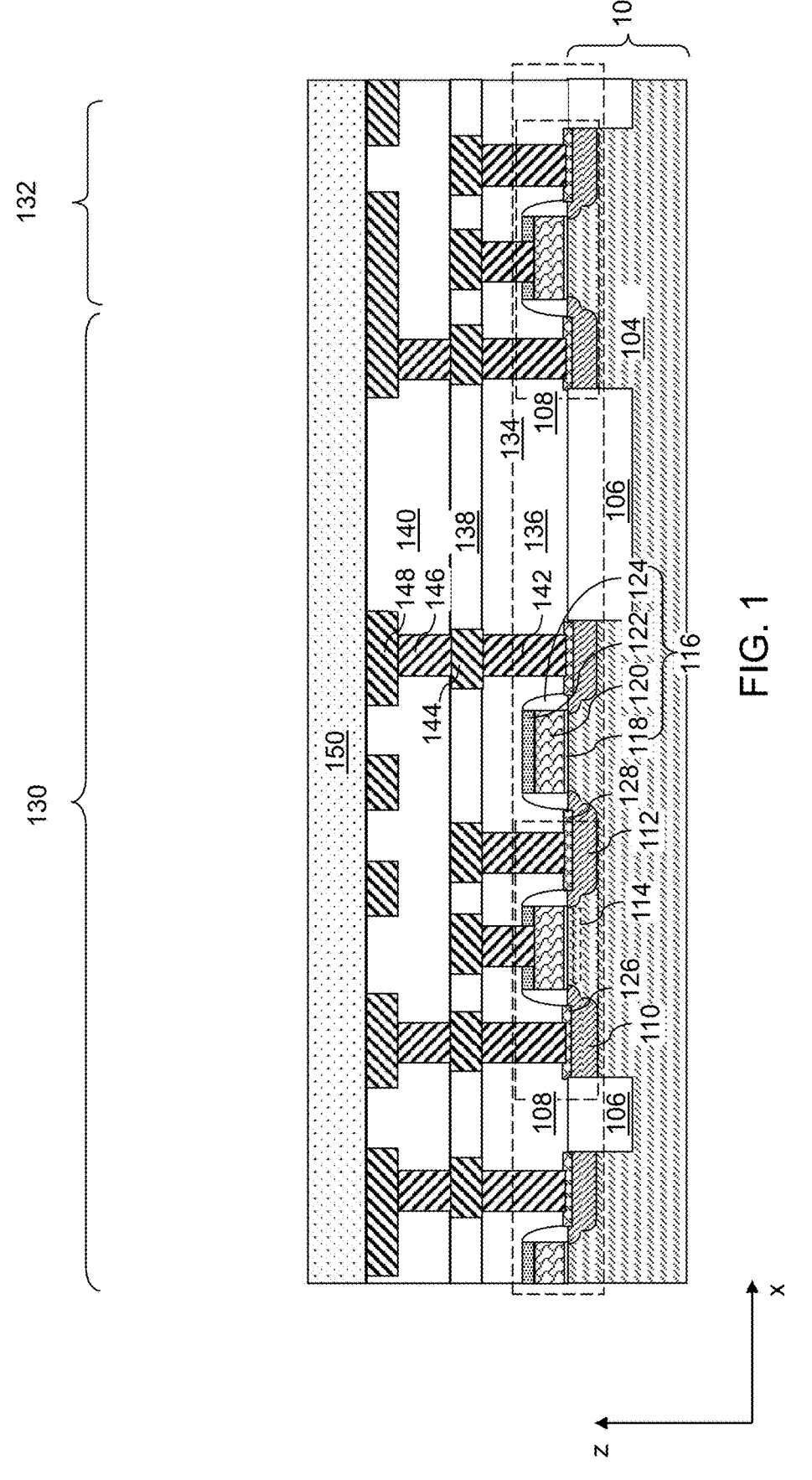
FIG. 1 is a vertical cross-sectional view of a first structure after formation of complementary metal-oxide-semiconductor (CMOS) transistors, first metal interconnect structures formed in lower-level dielectric material layers, and an isolation dielectric layer, according to various embodiments.

The following disclosure provides many different embodiments, or examples, for implementing different features of the provided subject matter. Specific examples of components and arrangements are described below to simplify this disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, this disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

Various embodiments of this disclosure provide semiconductor circuits and methods that may be advantageous in terms of manufacturing flexibility, reduced size, and reduced short channel effects. In this regard, an embodiment semiconductor circuit (e.g., a CMOS inverter) is provided that may be formed in a BEOL process and may be incorporated with other BEOL circuit components such as capacitors, inductors, resistors, and integrated passive devices. As such, the disclosed semiconductor circuit may include materials that may be processed at low temperatures. As a result, the fabrication of such a semiconductor circuit may not damage previously fabricated devices (e.g., FEOL and MEOL devices). Further, various embodiment semiconductor circuits may include a first-conductivity-type semiconductor layer disposed over an interlayer dielectric layer, a gate electrode disposed over the first-conductivity-type semiconductor layer, and a second-conductivity-type semiconductor layer disposed over the gate electrode in a vertically stacked configuration that may provide a semiconductor circuit having a reduced size relative to alternative structures that do not include such a vertically stacked configuration. The embodiment semiconductor circuits may allow longer channel lengths without increased device size, which may mitigate short-channel effects.

An embodiment inverter circuit may include a first-conductivity-type semiconductor layer disposed over an interlayer dielectric layer, a gate electrode disposed over the first-conductivity-type semiconductor layer, a second-conductivity-type semiconductor layer disposed over the gate electrode, a first gate dielectric layer disposed between the first-conductivity-type semiconductor layer and the gate electrode, a second gate dielectric layer disposed between the gate electrode and the second-conductivity-type semiconductor layer, a first source electrode that is in contact with the first-conductivity-type semiconductor layer, a second source electrode that is in contact with the second-conductivity-type semiconductor layer, and a shared drain electrode that is in contact with the first-conductivity-type semiconductor layer and the second-conductivity-type semiconductor layer. At least one of the first-conductivity-type layer and the second-conductivity-type layer may include a metal-oxide semiconductor and/or a multi-layer structure formed in a BEOL process that may be incorporated with other BEOL circuit components such as capacitors, inductors, resistors, and integrated passive devices.

In a further embodiment, a semiconductor circuit may include a p-type metal-oxide semiconductor layer disposed within an interlayer dielectric layer such that the p-type metal-oxide semiconductor layer is parallel to a horizontal interface of the interlayer dielectric layer, an n-type metal-oxide semiconductor layer disposed within the interlayer dielectric layer such that the n-type metal-oxide semiconductor layer is parallel to the p-type metal-oxide semiconductor layer, a gate electrode disposed within the interlayer dielectric layer such that the gate electrode is disposed between the p-type metal-oxide semiconductor layer and the n-type metal-oxide semiconductor layer, a first source electrode that is in contact with the p-type metal-oxide semiconductor layer, a second source electrode that is in contact with the n-type metal-oxide semiconductor layer, and a shared drain electrode electrically connecting the p-type metal-oxide semiconductor layer and the n-type metal-oxide semiconductor layer.

An embodiment method of forming a semiconductor circuit may include forming a first-conductivity-type semiconductor layer over an interlayer dielectric layer, forming a first source electrode in electrical contact with the first-conductivity-type semiconductor layer, forming a first gate dielectric layer over the first-conductivity-type semiconductor layer, forming a gate electrode over the first gate dielectric layer, forming a second gate dielectric layer over the gate electrode, forming a second-conductivity-type semiconductor layer over the second gate dielectric layer, forming a second source electrode in electrical contact with the second-conductivity-type semiconductor layer, and forming a shared drain electrode in electrical contact with the first-conductivity-type semiconductor layer and the second-conductivity-type semiconductor layer.

FIG. 1 illustrates a semiconductor structure 100, according to various embodiments. The semiconductor structure 100 includes a substrate 102, which may be a semiconductor substrate such as a commercially available silicon substrate. The substrate 102 may include a semiconductor material layer 104 or at least at an upper portion thereof. The semiconductor material layer 104 may be a surface portion of a bulk semiconductor substrate or may be a top semiconductor layer of a semiconductor-on-insulator (SOI) substrate. In one embodiment, the semiconductor material layer 104 includes a single crystalline semiconductor material such as single crystalline silicon. In one embodiment, the substrate 102 may include a single crystalline silicon substrate including a single crystalline silicon material.

Shallow trench isolation structures 106 including a dielectric material such as silicon oxide may be formed in an upper portion of the semiconductor material layer 104. Suitably doped semiconductor wells, such as p-type wells and n-type wells, may be formed within each area that is laterally enclosed by a portion of the shallow trench isolation structures 106. Field effect transistors 108 may be formed over a top surface of the semiconductor material layer 104. For example, each of the field effect transistors 108 may include a source electrode 110, a drain electrode 112, a semiconductor channel 114 that includes a surface portion of the substrate 102 extending between the source electrode 110 and the drain electrode 112, and a gate structure 116. The semiconductor channel 114 may include a single crystalline semiconductor material.

Each gate structure 116 may include a gate dielectric layer 118, a gate electrode 120, a gate cap dielectric 122, and a dielectric gate spacer 124. A source-side metal-semiconductor alloy region 126 may be formed on each source electrode 110, and a drain-side metal-semiconductor alloy region 128 may be formed on each drain electrode 112. The devices formed on the top surface of the semiconductor material layer 104 may include complementary metal-oxide-semiconductor (CMOS) transistors and optionally additional semiconductor devices (such as resistors, diodes, capacitors, etc.), and are collectively referred to as CMOS circuitry 134.

The semiconductor structure 100 of FIG. 1 may include a memory array region 130 in which an array of memory cells may be subsequently formed. The first exemplary structure may further include a peripheral region 132 in which metal wiring for the array of memory devices is provided. Generally, the field effect transistors 108 in the CMOS circuitry 134 may be electrically connected to an electrode of a respective memory cell by a respective set of metal interconnect structures.

Devices (such as field effect transistors 108) in the peripheral region 132 may provide functions that operate the array of memory cells to be subsequently formed. Specifically, devices in the peripheral region may be configured to control the programming operation, the erase operation, and the sensing (read) operation of the array of memory cells. For example, the devices in the peripheral region 132 may include a sensing circuitry and/or a programming circuitry.

One or more of the field effect transistors 108 in the CMOS circuitry 134 may include a semiconductor channel 114 that contains a portion of the semiconductor material layer 104 in the substrate 102. In embodiments in which the semiconductor material layer 104 includes a single crystalline semiconductor material such as single crystalline silicon, the semiconductor channel 114 of each of the field effect transistors 108 in the CMOS circuitry 134 may include a single crystalline semiconductor channel such as a single crystalline silicon channel. In one embodiment, a plurality of field effect transistors 108 in the CMOS circuitry 134 may include a respective node that is subsequently electrically connected to a node of a respective memory cell to be subsequently formed. For example, a plurality of field effect transistors 108 in the CMOS circuitry 134 may include a respective source electrode 110 or a respective drain electrode 112 that is subsequently electrically connected to a node of a respective memory cell to be subsequently formed.

In one embodiment, the CMOS circuitry 134 may include a programming control circuit configured to control gate voltages of a set of field effect transistors 108 that may be used for programming a respective memory cell (e.g., a ferroelectric memory cell) and to control gate voltages of transistors (e.g., thin-film transistors) to be subsequently formed. In this embodiment, the programming control circuit may be configured to provide a first programming pulse that programs a respective ferroelectric dielectric material layer in a selected ferroelectric memory cell into a first polarization state in which electrical polarization in the ferroelectric dielectric material layer points toward a first electrode of the selected ferroelectric memory cell, and to provide a second programming pulse that programs the ferroelectric dielectric material layer in the selected ferroelectric memory cell into a second polarization state in which the electrical polarization in the ferroelectric dielectric material layer points toward a second electrode of the selected ferroelectric memory cell.

In one embodiment, the substrate 102 may include a single crystalline silicon substrate, and the field effect transistors 108 may include a respective portion of the single crystalline silicon substrate as a semiconducting channel. As used herein, a "semiconducting" element refers to an element having electrical conductivity in the range from $1.0 \times 10^{-6}$ S/cm to $1.0 \times 10^{-5}$ S/cm. As used herein, a "semiconductor material" refers to a material having electrical conductivity in the range from $1.0 \times 10^{-6}$ S/cm to $1.0 \times 10^{-5}$ S/cm in the absence of electrical dopants therein and is capable of producing a doped material having electrical conductivity in a range from 1.0 S/cm to $1.0 \times 10^{-5}$ S/cm upon suitable doping with an electrical dopant.

According to an embodiment, the field effect transistors 108 may be subsequently electrically connected to drain electrodes and gate electrodes of access transistors including semiconducting metal oxide plates to be formed above the field effect transistors 108. In one embodiment, a subset of the field effect transistors 108 may be subsequently electrically connected to at least one of the drain electrodes and the gate electrodes. For example, the field effect transistors 108 may include first word line drivers configured to apply a first gate voltage to first word lines through a first subset of lower-level metal interconnect structures to be subsequently formed, and second word line drivers configured to apply a second gate voltage to second word lines through a second subset of the lower-level metal interconnect structures. Further, the field effect transistors 108 may include bit line drivers configured to apply a bit line bias voltage to bit lines to be subsequently formed, and sense amplifiers configured to detect electrical current that flows through the bit lines during a read operation.

Various metal interconnect structures formed within dielectric material layers may be subsequently formed over the substrate 102 and the semiconductor devices thereupon (such as field effect transistors 108). In an illustrative example, the dielectric material layers may include, for example, a first dielectric material layer 136 that may be a layer that surrounds the contact structure connected to the source and drains (sometimes referred to as a contact-level dielectric material layer), a first interconnect-level dielectric material layer 138, and a second interconnect-level dielectric material layer 140. The metal interconnect structures may include device contact via structures 142 formed in the first dielectric material layer 136 and contacting a respective component of the CMOS circuitry 134, first metal line structures 144 formed in the first interconnect-level dielectric material layer 138, first metal via structures 146 formed in a lower portion of the second interconnect-level dielectric material layer 140, and second metal line structures 148 formed in an upper portion of the second interconnect-level dielectric material layer 140.

Each of the dielectric material layers (136, 138, 140) may include a dielectric material such as undoped silicate glass, a doped silicate glass, organosilicate glass, amorphous fluorinated carbon, porous variants thereof, or combinations thereof. Each of the metal interconnect structures (142, 144, 146, 148) may include at least one conductive material, which may be a combination of a metallic liner (such as a metallic nitride or a metallic carbide) and a metallic fill material. Each metallic liner may include TiN, TaN, WN, TiC, TaC, and WC, and each metallic fill material portion may include W, Cu, Al, Co, Ru, Mo, Ta, Ti, TiN, alloys thereof, and/or combinations thereof.

Other suitable metallic liner and metallic fill materials within the contemplated scope of disclosure may also be used. In one embodiment, the first metal via structures 146 and the second metal line structures 148 may be formed as integrated line and via structures by a dual damascene process. The dielectric material layers (136, 138, 140) are herein referred to as lower-lower-level dielectric material layers. The metal interconnect structures (142, 144, 146, 148) formed within the lower-level dielectric material layers are herein referred to as lower-level metal interconnect structures.

While the disclosure is described using an embodiment in which an array of memory cells may be formed over the second line-and-via-level dielectric material layer 140, embodiments are expressly contemplated herein in which the array of memory cells may be formed at a different metal interconnect level.

An array of thin-film transistors and an array of ferroelectric memory cells (or other types of memory cells) may be subsequently deposited over the dielectric material layers (136, 138, 140) that have formed therein the metal interconnect structures (142, 144, 146, 148). The set of all dielectric material layers that are formed prior to formation of an array of thin-film transistors or an array of ferroelectric memory cells is collectively referred to as lower-level dielectric material layers (136, 138, 140). The set of all metal interconnect structures that is formed within the lower-level dielectric material layers (136, 138, 140) is herein referred to as first metal interconnect structures (142, 144, 146, 148). Generally, first metal interconnect structures (142, 144, 146, 148) formed within at least one lower-level dielectric material layer (136, 138, 140) may be formed over the semiconductor material layer 104 that is located in the substrate 102.

According to an embodiment, thin-film transistors may be subsequently formed in a metal interconnect level that overlies that metal interconnect levels that contain the lower-level dielectric material layers (136, 138, 140) and the first metal interconnect structures (142, 144, 146, 148). In one embodiment, a planar dielectric material layer having a uniform thickness may be formed over the lower-level dielectric material layers (136, 138, 140). The planar dielectric material layer is herein referred to as an insulating matrix layer 150. The insulating matrix layer 150 may include a dielectric material such as undoped silicate glass, a doped silicate glass, organosilicate glass, or a porous dielectric material, and may be deposited by chemical vapor deposition. The thickness of the insulating matrix layer 150 may be in a range from 20 nm (i.e., 200 angstrom) to 300 nm (i.e., 3000 angstrom), although lesser and greater thicknesses may also be used.

Generally, interconnect-level dielectric layers (such as the lower-level dielectric material layer (136, 138, 140)) containing therein the metal interconnect structures (such as the first metal interconnect structures (142, 144, 146, 148)) may be formed over semiconductor devices. The insulating matrix layer 150 may be formed over the interconnect-level dielectric layers. Other passive devices may be formed in BEOL processes. For example various capacitors, inductors, resistors, and integrated passive devices may be utilized with other BEOL devices.

Figures 2A, 2B, 2C:
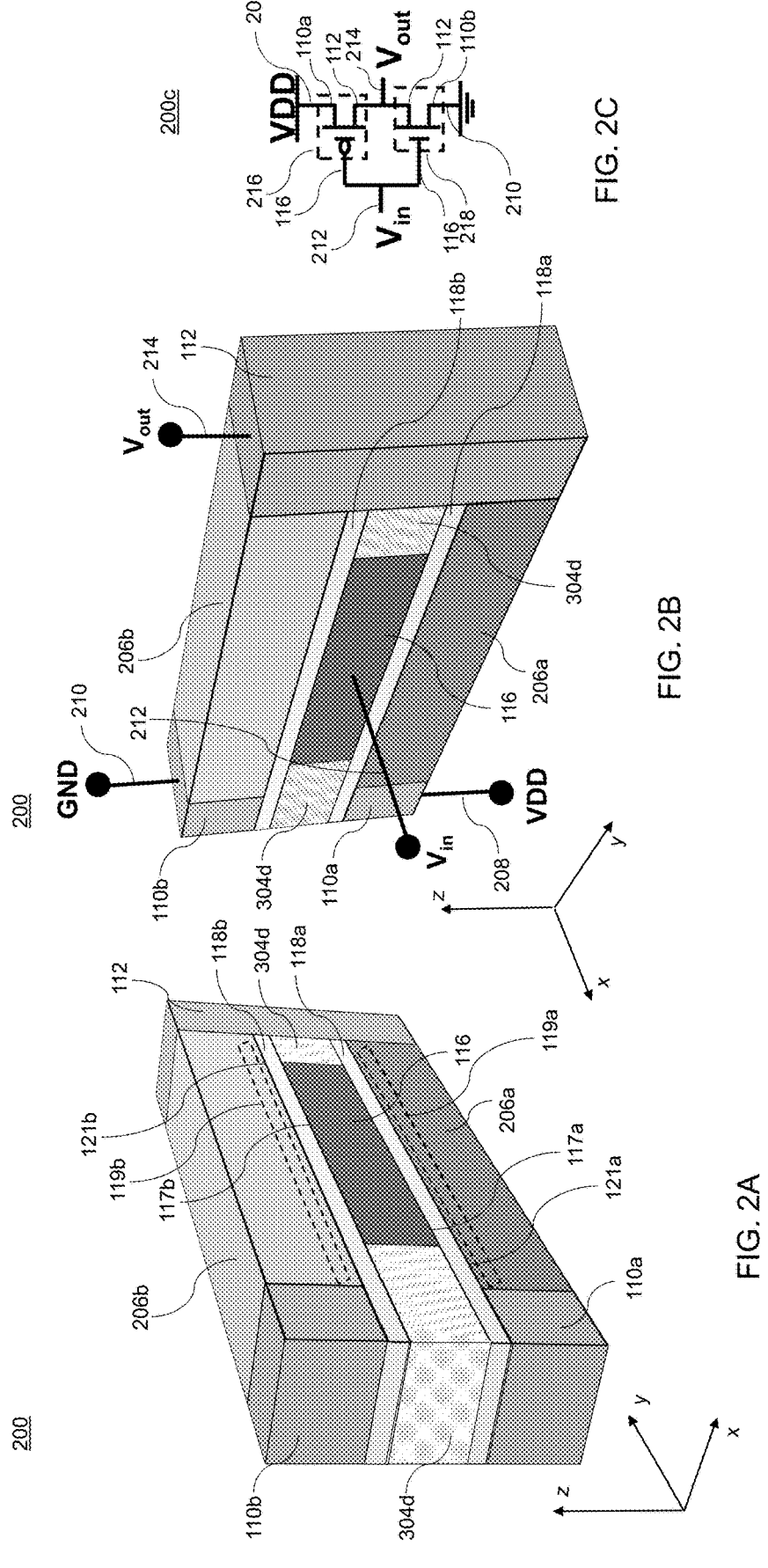
FIG. 2A is a three-dimensional perspective view of a semiconductor circuit that may be formed in a BEOL process, according to various embodiments.
FIG. 2B is a further three-dimensional perspective view of the semiconductor circuit of FIG. 2A, according to various embodiments.
FIG. 2C is a schematic equivalent circuit describing the semiconductor circuit of FIGS. 2A and 2B, according to various embodiments.

FIG. 2A is a three-dimensional perspective view of a semiconductor circuit 200 that may be formed in a BEOL process, and FIG. 2B is a further three-dimensional perspective view of the semiconductor circuit 200 of FIG. 2A, according to various embodiments. FIG. 2C is a schematic equivalent circuit 200c describing the semiconductor circuit 200 of FIGS. 2A and 2B, according to various embodiments. As shown in FIGS. 2A and 2B, the semiconductor circuit 200 may include a first-conductivity-type semiconductor layer (e.g., a p-type semiconductor layer 206a) disposed over an interlayer dielectric layer. For example, the semiconductor circuit 200 may be disposed over the insulating matrix layer 150 (e.g., see FIG. 1) or over one or more additional interconnect layers disposed over the insulating matrix layer 150. The semiconductor circuit 200 may further include a gate electrode 116 disposed over the first-conductivity-type semiconductor layer 206a and a second-conductivity-type semiconductor layer (e.g., an n-type semiconductor layer 206b) disposed over the gate electrode 116.

A first gate dielectric layer 118a may be disposed between the first-conductivity-type semiconductor layer 206a and the gate electrode 116 and a second gate dielectric layer 118b may be disposed between the gate electrode 116 and the second-conductivity-type semiconductor layer 206b. The semiconductor circuit 200 may further include a first source electrode 110a that is in contact with the first-conductivity-type semiconductor layer 206a and a second source electrode 110b that is in contact with the second-conductivity-type semiconductor layer 206b. The semiconductor circuit 200 may further include a shared drain electrode 112 in contact with the first conductivity-type semiconductor layer 206a and the second-conductivity-type semiconductor layer 206b.

As described above, the semiconductor circuit 200 may be disposed over an interlayer dielectric layer having horizontal interface (e.g., see insulating matrix layer 150 of FIG. 1). As shown in FIG. 2A, the gate electrode 116 may include a first surface 117a that is adjacent to the first-conductivity-type semiconductor layer 206a and is parallel to the horizontal interface of the interlayer dielectric layer 150. The gate electrode 116 may include a second surface 117b that is adjacent to the second-conductivity-type semiconductor layer 206b and is also parallel to the horizontal interface of the interlayer dielectric layer 150. The first-conductivity-type semiconductor layer 206a may include a first channel layer 119a disposed along a first horizontal plane 121a that is adjacent to the first surface 117a of the gate electrode 116. Similarly, the second-conductivity-type semiconductor layer 206b may include a second channel layer 119b disposed along a second horizontal plane 121b that is adjacent to the second surface 117b of the gate electrode 116. As such, the semiconductor circuit 200 may include twin channels (119a, 119b) and one gate electrode 116 that may be used to form an inverter circuit 200c, as described in greater detail with reference to FIG. 2C, below.

As shown in FIGS. 2A and 2B, the semiconductor circuit 200 may include a further interlayer dielectric layer (e.g., the fourth interlayer dielectric layer 304d described below; see FIGS. 9A to 19E) partially surrounding the gate electrode 116. According to various embodiments, the fourth interlayer dielectric layer 304d may include one or more of $AlO_x$, $SiO_2$, $SiN_x$, etc., or any suitable interlayer dielectric material.

As shown in FIG. 2B, the first source electrode 110a may be electrically connected to a voltage supply 208 (e.g., that may be held at a source voltage VDD) and the second source electrode 110b may be connected to a ground voltage terminal 210 (e.g., that may be held at a ground (GND) voltage). The gate electrode 116 may be connected to an input signal (Vin) terminal 212 and the shared drain electrode 112 may be electrically connected to an output signal (Vout) terminal 214. As such, the semiconductor circuit 200 may be configured as an inverter circuit 200c, as shown in FIG. 2C.

In this regard, the p-type semiconductor layer 206a may be configured to include a horizontal p-channel layer 119a of a p-channel metal oxide semiconductor field effect transistor (MOSFET) (i.e., a pFET 216) and the n-type semiconductor layer 206b may be configured to include a horizontal n-channel layer 119b of an n-channel MOSFET transistor (i.e., an nFET 218). Thus, the pFET 216 may include the p-type semiconductor layer 206a, the first source electrode 110a, the shared drain electrode 112, the first gate dielectric layer 118a, and the gate electrode 116. Similarly, the nFET 218 may include the n-type semiconductor layer 206b, the second source electrode 110b, the shared drain electrode 112, the second gate dielectric layer 118b, and the gate electrode 116.

A low voltage placed on the input signal terminal 212 turns on the pFET 216 and turns off the nFET 218. Since the source of the pFET 216 (i.e., the first source electrode 110a) is connected to the voltage supply 208 that has a high voltage, the output voltage Vout (i.e., the voltage at the shared drain electrode 112) will have a high voltage. Similarly, a high voltage placed on the input signal terminal 212 turns on the nFET 218 and turns off the pFET 216. Since the source of the nFET 218 (i.e., the second source electrode 110b) is connected to a ground voltage terminal, the output voltage Vout (i.e., the voltage at the shared drain electrode 112) will have a low voltage. In this way, a high input signal is converted to a low output signal and a low input signal is converted to a high input signal. As such, the semiconductor circuit 200 may be configured as an inverter circuit 200c.

The interlayer dielectric layer on which the semiconductor circuit 200 is disposed (e.g., see lower-level dielectric material layers (136, 138, 140) in FIG. 1) may include one or more electrical interconnect structures (e.g., see first metal interconnect structures (142, 144, 146, 148) in FIG. 1) which may be electrically connected to the semiconductor circuit 200 of FIGS. 2A and 2B. In this regard, one or more of the first source electrode 110a, the second source electrode 110b, the shared drain electrode 112, and the gate electrode 116, may be electrically connected to the one or more electrical interconnect structures (142, 144, 146, 148) formed in one or more dielectric material layers (136, 138, 140) below the semiconductor circuit 200. In other embodiments, one or more of the first source electrode 110a, the second source electrode 110b, the shared drain electrode 112, and the gate electrode 116, may be electrically connected to one or more electrical interconnect structures to be subsequently formed above the semiconductor circuit 200.

In one or more embodiments, one or both of the p-type semiconductor layer 206a and the n-type semiconductor layer 206b may include metal-oxide semiconductors. For example, the p-type semiconductor layer 206a may include one or more of NiO, SnO, $Cu_2O$, etc., and the n-type semiconductor layer 206b may include one or more of amorphous silicon, $Al_2O_5Zn_2$ doped ZnO, InGaZnO, InGaO, InWO, InZnO, InSnO, $Ga_2O_3$, ZnO, GaO, InO, $In_2O_3$, InZnO, ZnO, TiOx, and alloys thereof. In some embodiments, the n-type semiconductor layer 206b may have a composition given by $In_x$ $Ga_y$ $Zn_z$ MO, wherein $0<x<1$; $0\le y\le 1$; $0\le z\le 1$; and M is one of Ti, Al, Ag, Ce, and Sn. In other embodiments, the n-type semiconductor layer 206b may include an alloy of oxygen, a group-III element, and a group-V element. In other embodiments, the one or more of the n-type semiconductor layer and the p-type semiconductor layer may be formed of a metal-oxide semiconductor having a multi-layer structure.

In some embodiments, one or more of the first gate dielectric layer 118a and the second gate dielectric layer 118b may include a high-k dielectric material and may include one or more of silicon oxide, aluminum oxide, hafnium oxide, hafnium lanthanum oxide, hafnium silicon oxide, hafnium tantalum oxide, hafnium titanium oxide, hafnium zirconium oxide, zirconium oxide, titanium oxide, tantalum oxide, hafnium dioxide-alumina, etc. As described in greater detail below, one or more of the first source electrode 110a, the second source electrode 110b, the shared drain electrode 112 may include one or more of TiN, W, WN, WCN, Co, PdCo, Mo, Cu, TaN, Ti, Al, etc. Other suitable conductor materials may be within the contemplated scope of disclosure. For example, in some embodiments, one or more of the first source electrode 110a, the second source electrode 110b, and the shared drain electrode 112 may further include one or more alloys of one or more of W, Mo, Co, Pd, Ti, and mixtures thereof, with or without N and/or O, deposited by chemical vapor deposition or by atomic layer deposition.

Figure 2D:
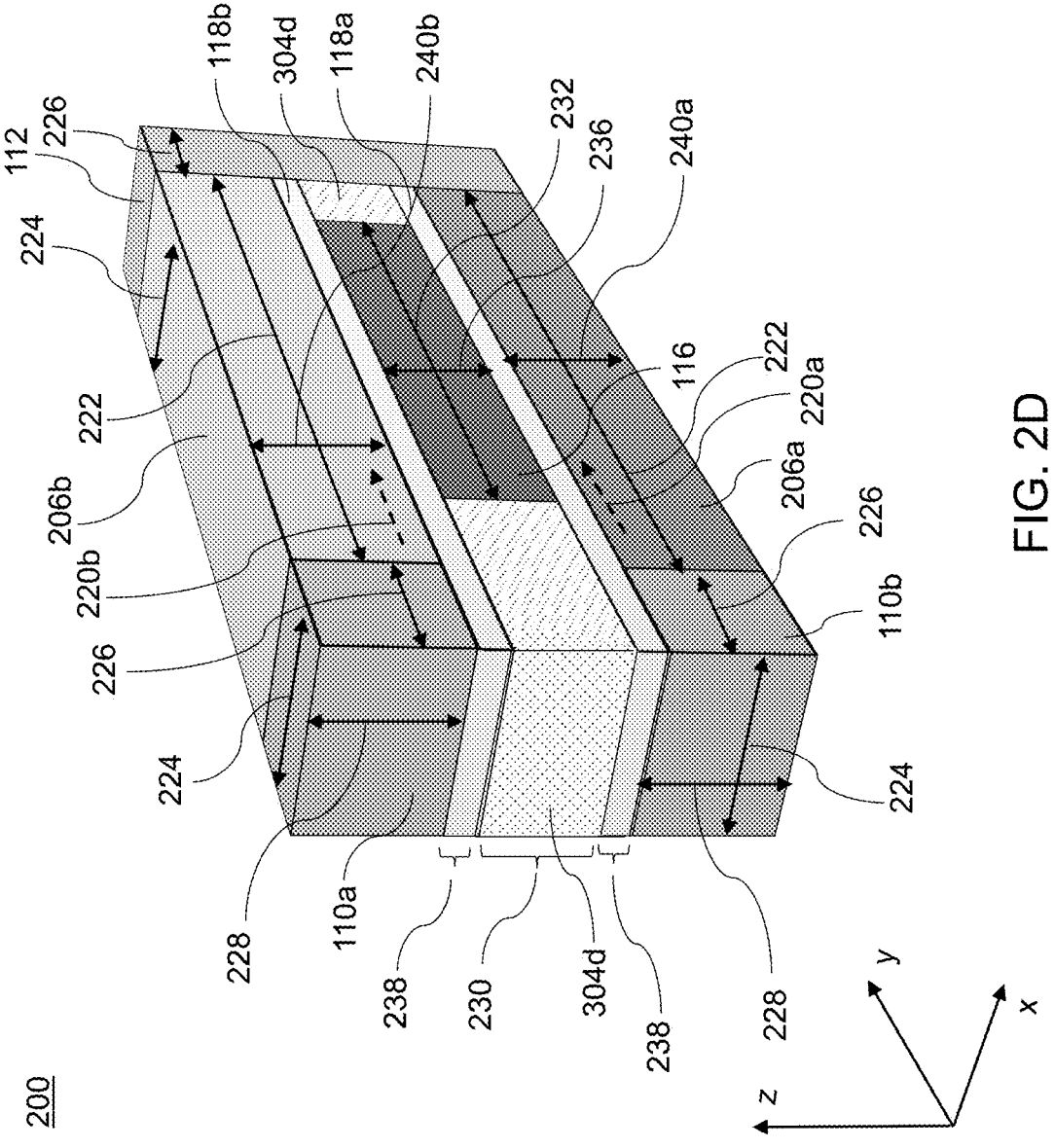
FIG. 2D is a further three-dimensional perspective view of the semiconductor circuit of FIG. 2A showing various dimensions of components of the semiconductor circuit, according to various embodiments.

FIG. 2D is a further three-dimensional perspective view showing various dimensions of components of the semiconductor circuit 200 of FIG. 2A, according to various embodiments. As described above, the p-type semiconductor layer 206a may be configured to include a p-channel layer 119a (e.g., see FIG. 2A) of a pFET 216 device (e.g., see FIG. 2C) and the n-type semiconductor layer 206b may be configured to include an n-channel layer 119b (e.g., see FIG. 2A) of an nFET 218 device (e.g., see FIG. 2C). As such, in instances in which the respective devices (pFET 216, nFET 218) are activated, current may flow as indicated by the dashed arrows (220a, 220b) in FIG. 2D. In this regard, when the pFET 216 is activated (e.g., by applying a low or zero bias to the gate electrode 116) positive charge carriers (i.e., "holes") may flow from the first source electrode 110a to the shared drain electrode 112 (e.g., see FIG. 2B) giving rise to a first current 220a. Similarly, when the nFET 218 is activated (e.g., by applying a high bias to the gate electrode 116) negative charger carriers (i.e., electrons) may flow from the shared drain electrode 112 to the second source electrode 110b but, since the current carried by a negative charge is opposite to its motion, the charge motion in the nFET 218 gives rise to a second current 220b, which is in the same direction as first current 220a that flows in the pFET 216.

Each of the p-type semiconductor layer 206a and the n-type semiconductor layer 206b may have a respective channel length 222 and a respective channel width 224. The channel length 222 may have a value greater than 10 nm in various embodiments. An increased value of the channel length 222 may mitigate short channel effects. However, increasing the channel length 222 may result in reduced driving current and a greater size of the semiconductor circuit 200. Thus, it may be possible to optimize the channel length 222 to determine a value sufficiently large to avoid short channel effects while also keeping the size of the semiconductor circuit 200 as small as possible. The channel width 224 may also have a value that is greater than 10 nm, according to various embodiments.

Each of the first source electrode 110*a*, the second source electrode 110*b*, and the shared drain electrode 112 may have a source/drain width that is approximately equal to the channel width 224 as shown, for example, in FIG. 2D. Each of the source/drain electrodes (110*a*, 110*b*, 112) may also have a source/drain length 226 and source/drain thickness 228, which each may have values that are greater than 5 nm (e.g., 5 nm to 100 nm). The fourth interlayer dielectric layer 304*d* may have a thickness 230 that is greater than 5 nm and less than 500 nm. The gate electrode 116 may have a gate length 232 and a gate width (not shown) that may be comparable to the channel length 222 and the channel width 224, respectively. In this regard, the gate length 232 may be greater than 10 nm and the gate width may be greater than 10 nm and less than 500 nm. The gate electrode 116 may have a gate thickness 236 that may have a value that is greater than 5 nm and less than 150 nm. The first gate dielectric layer 118*a* and the second gate dielectric layer 118*b* may each have a gate dielectric thickness 238 that is greater than 2 nm and less than 20 nm. The p-type semiconductor layer 206*a* may have a p-type thickness 240*a*, and the n-type semiconductor layer 206*b* may have an n-type thickness 240*b*, each of which may each be greater than 2 nm and less than 50 nm.

FIG. 3A is a top view of an intermediate structure 300 that may be used in the formation of a semiconductor circuit 200, FIG. 3B is a first vertical cross-sectional view of the intermediate structure 300 of FIG. 3A, FIG. 3C is a second vertical cross-sectional view of the intermediate structure 300 of FIG. 3A, and FIG. 3D is a third vertical cross-sectional view of the intermediate structure 300 of FIG. 3A, according to various embodiments. The vertical planes defining the views in FIGS. 3B, 3C, and 3D are respectively indicated by the cross sections B-B', C-C', and D-D' in FIG. 3A. As shown in FIGS. 3B to 3D, the intermediate structure 300 may include a substrate 302, a first interlayer dielectric layer 304*a*, an etch-stop layer 306L, first oxide semiconductor layer 206La, a second interlayer dielectric layer 304*b*, and a photoresist 308L.

The substrate 302 may be formed in a BEOL process and, as such, may be a dielectric layer (e.g., an interlayer dielectric or insulating matrix layer 150 from FIG. 1). For example, the substrate 302 may include undoped silicate glass, a doped silicate glass (e.g., deposited by decomposition of tetraethylorthosilicate (TEOS)), organosilicate glass, silicon oxynitride, or silicon carbide nitride. Other suitable dielectric materials are within the contemplated scope of disclosure. The dielectric material of the substrate 302 may be deposited by a conformal deposition process (such as a chemical vapor deposition process) or a self-planarizing deposition process (such as spin coating). The thickness of the substrate 302 may each be in a range from approximately 15 nm to approximately 60 nm, such as from approximately 20 nm to approximately 40 nm, although smaller and larger thicknesses may also be used.

The first interlayer dielectric layer 304*a* may include, but is not limited to, silicon dioxide, silicon nitride, silicon oxynitride, hafnium oxide, hafnium silicon oxide, hafnium tantalum oxide, hafnium titanium oxide, hafnium zirconium oxide, zirconium oxide, titanium oxide, aluminum oxide, hafnium dioxide-alumina, or various other insulating structures such as a multi-layer stack structure including alternating insulating layers. The first interlayer dielectric layer 304*a* may be deposited by a conformal deposition process (e.g., chemical vapor deposition (CVD), atomic layer deposition (ALD), physical vapor deposition (PVD), plasma enhanced chemical vapor deposition (PECVD), etc.) or by a self-planarizing deposition process (such as spin coating). In this example, the first interlayer dielectric layer 304*a* may be formed as a planar blanket (i.e., un-patterned) layer having a planar top surface and a planar bottom surface. Excess portions of the first interlayer dielectric layer 304*a* may be removed by a planarization process, for example, by chemical mechanical planarization (CMP). A thickness of the first interlayer dielectric layer 304*a* may be in a range from approximately 5 nm to approximately 50 nm, such as from approximately 20 nm to approximately 40 nm, although other embodiments may include smaller and larger thicknesses.

The etch-stop layer 306L may include an etch-stop material such as silicon nitride, silicon carbide, silicon nitride carbide, or a dielectric metal oxide (such as aluminum oxide, titanium oxide, tantalum oxide, etc.). The etch-stop layer 306L may be deposited by a conformal or non-conformal deposition process. In one embodiment, the etch-stop layer 306L may be deposited by CVD, ALD, or PVD. A thickness of the etch-stop layer 306L may be in a range from approximately 2 nm to approximately 20 nm, such as from approximately 3 nm to approximately 12 nm, although smaller and larger thicknesses may also be used.

The first oxide semiconductor layer 206La may be first-conductivity-type semiconductor layer such as a p-type semiconducting material including, but not limited to, NiO, SnO, $Cu_2O$, etc., which may be formed by any suitable method such as ALD, CVD, PECVD, PVD, etc. A thickness of the first oxide semiconductor layer 206La may be in a range from approximately 2 nm to approximately 50 nm, such as from approximately 5 nm to approximately 15 nm, although other embodiments may include smaller and larger thicknesses. Following the deposition of the first oxide semiconductor layer 206La, the intermediate structure 300 may optionally be annealed. The optional annealing process may be performed at a temperature in a range from 200° C. to 400° C. using a rapid thermal annealing or furnace annealing process. The annealing may be performed in an environment of nitrogen, oxygen, or a mixture thereof. In other embodiments, the first oxide semiconductor layer 206La may be an n-type semiconducting layer.

The second interlayer dielectric layer 304*b* may be formed over the first oxide semiconductor layer 206La using materials and processes similar to those described above with reference to the first interlayer dielectric layer 304*a*. In this regard, the second interlayer dielectric layer 304*b* may be the same material as the first interlayer dielectric layer 304*a*. Alternatively, the first interlayer dielectric layer 304*a* and the second interlayer dielectric layer 304*b* may be different materials. The second interlayer dielectric layer 304*b* may include, but is not limited to, silicon dioxide, silicon nitride, silicon oxynitride, hafnium oxide, hafnium silicon oxide, hafnium tantalum oxide, hafnium titanium oxide, hafnium zirconium oxide, zirconium oxide, titanium oxide, aluminum oxide, hafnium dioxide-alumina, or various other insulating structures such as a multi-layer stack structure including alternating insulating layers. The second interlayer dielectric layer 304*b* may be deposited by a conformal deposition process (e.g., CVD, ALD, PVD, PECVD, etc.) or by a self-planarizing deposition process (such as spin coating). Excess portions of the second interlayer dielectric layer 304*b* may be removed by a planarization process, for example, by CMP.

Figures 4A, 4B, 4C, 4D:
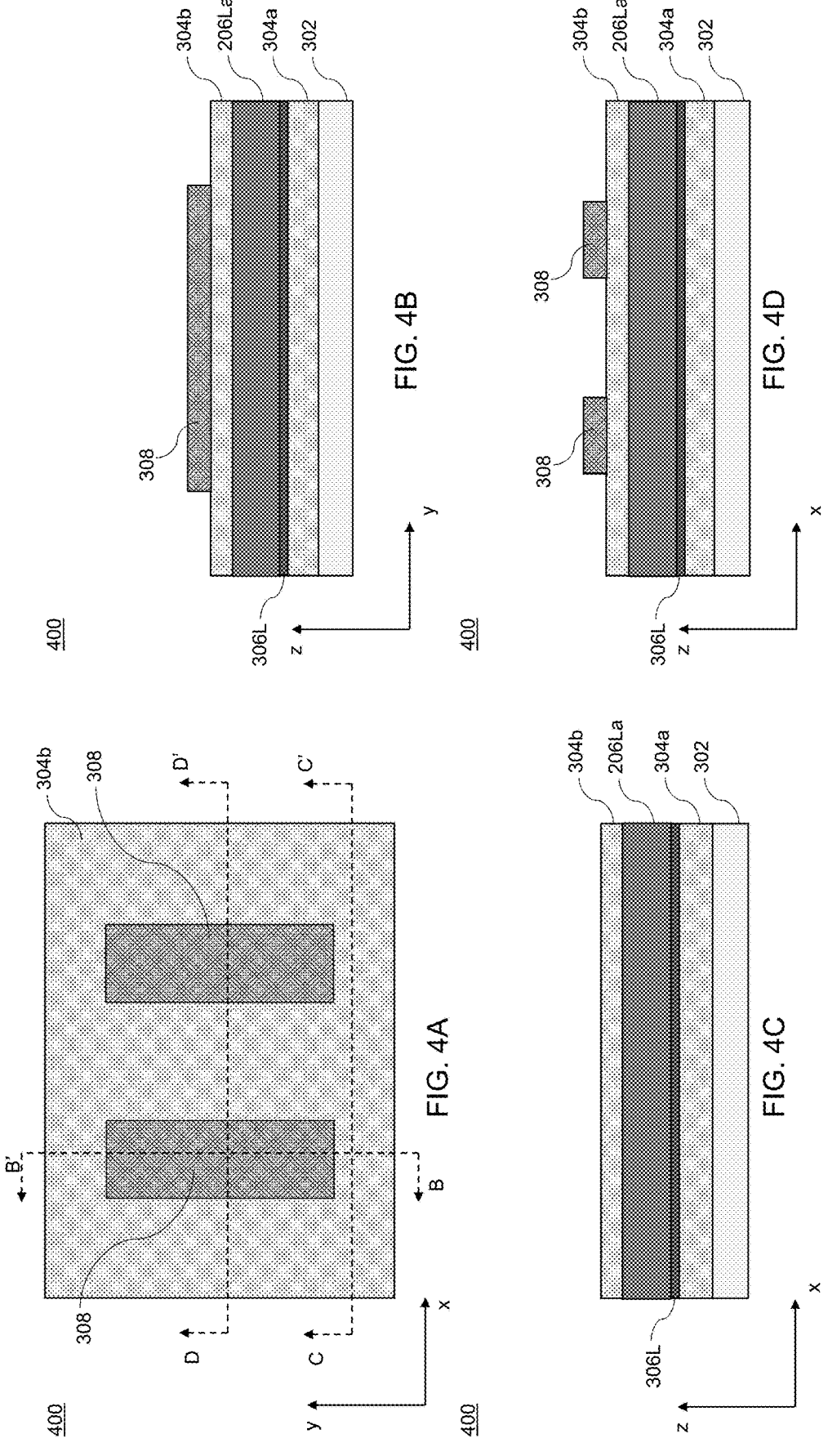
FIG. 4A is a top view of a further intermediate structure that may be used in the formation of a semiconductor circuit, according to various embodiments.
FIG. 4B is a first vertical cross-sectional view of the intermediate structure of FIG. 4A, according to various embodiments.
FIG. 4C is a second vertical cross-sectional view of the intermediate structure of FIG. 4A, according to various embodiments.
FIG. 4D is a third vertical cross-sectional view of the intermediate structure of FIG. 4A, according to various embodiments.

FIG. 4A is a top view of an intermediate structure 400 that may be used in the formation of a semiconductor circuit 200, FIG. 4B is a first vertical cross-sectional view of the intermediate structure 400 of FIG. 4A, FIG. 4C is a second vertical cross-sectional view of the intermediate structure 400 of FIG. 4A, and FIG. 4D is a third vertical cross-sectional view of the intermediate structure 400 of FIG. 4A, according to various embodiments. The vertical planes defining the views in FIGS. 4B, 4C, and 4D are respectively indicated by the cross sections B-B', C-C', and D-D' in FIG. 4A. The intermediate structure 400 may be formed from the intermediate structure 300 of FIGS. 3A to 3D by forming the patterned photoresist 308. In this regard, the photoresist 308L of FIGS. 3A to 3D may be formed over the second interlayer dielectric layer 304b and may then be patterned using lithographic techniques to form the patterned photoresist 308 as shown in FIGS. 4A to 4D.

According to some embodiments, the patterned photoresist 308 may be formed as a periodic array of rectangular shapes over the second interlayer dielectric layer 304b. For example, the view of FIGS. 4A to 4D may correspond to one repeat unit of the periodic array of rectangular shapes. Each portion of the patterned photoresist 308 may have width along a first horizontal direction (i.e., the x direction in FIG. 4A) and a length along a second horizontal direction (i.e., the y direction in FIG. 4A). The patterned photoresist 308 may then be used as a mask to pattern the second interlayer dielectric layer 304b and the first oxide semiconductor layer 206La, as described in greater detail with reference to FIGS. 5A and 5D, below.

FIG. 5A is a top view of an intermediate structure 500 that may be used in the formation of a semiconductor circuit 200, FIG. 5B is a first vertical cross-sectional view of the intermediate structure 500 of FIG. 5A, FIG. 5C is a second vertical cross-sectional view of the intermediate structure 500 of FIG. 5A, and FIG. 5D is a third vertical cross-sectional view of the intermediate structure 500 of FIG. 5A, according to various embodiments. The vertical planes defining the views in FIGS. 5B, 5C, and 5D are respectively indicated by the cross sections B-B', C-C', and D-D' in FIG. 5A. The intermediate structure 500 may be formed from the intermediate structure 400 of FIGS. 4A to 4D by performing an anisotropic etch process to remove portions of the second interlayer dielectric layer 304b and the first oxide semiconductor layer 206La that are not masked by the patterned photoresist 308. The resulting intermediate structure 500 includes the patterned first-conductivity-type semiconductor layer 206a described above with reference to FIGS. 2A, 2B, and 2D along with a remaining portion of the second interlayer dielectric layer 304b. The patterned photoresist 308 may then be removed by ashing or by dissolution with a solvent.

Figures 6A, 6B, 6C, 6D:
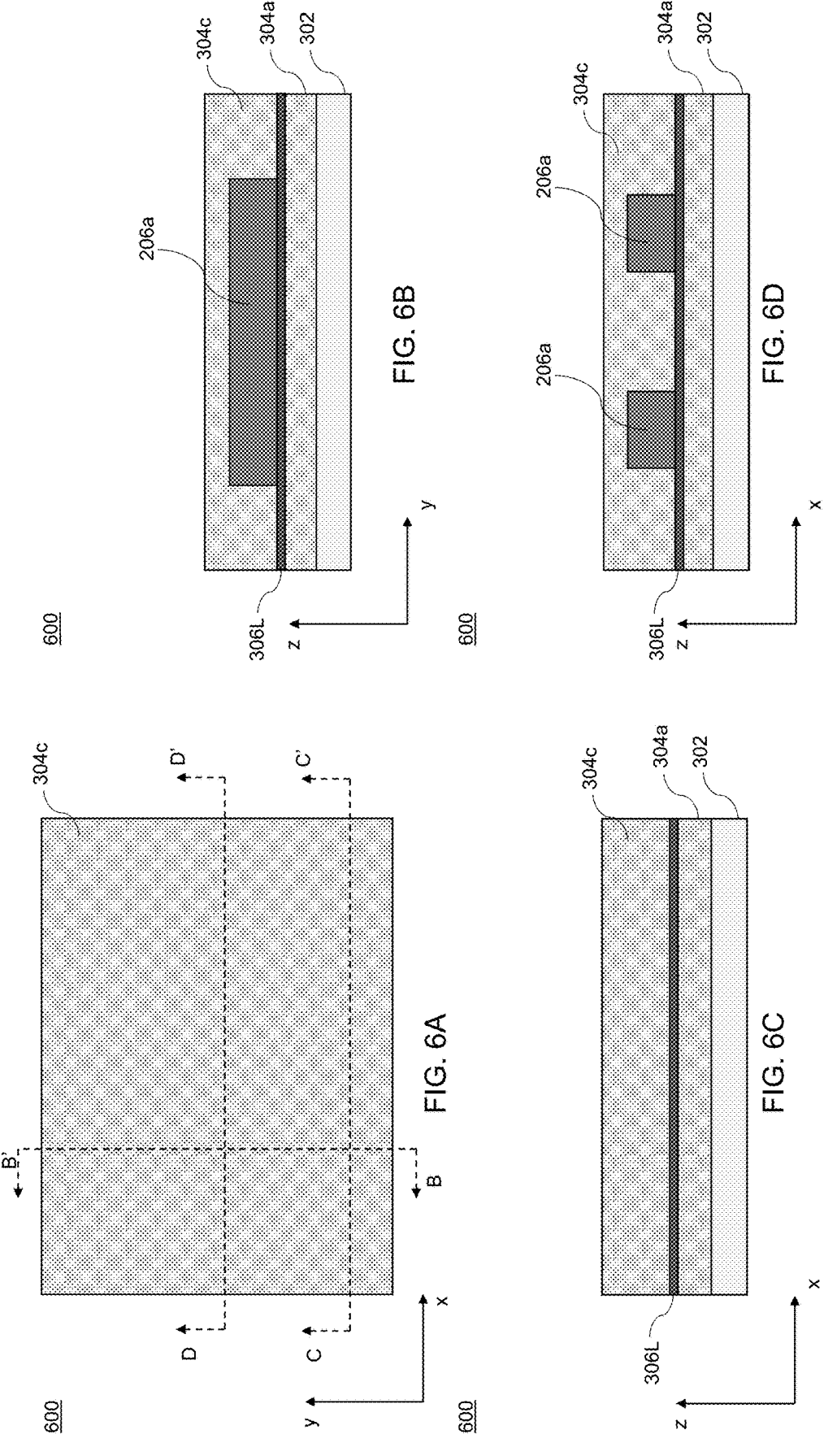
FIG. 6A is a top view of a further intermediate structure that may be used in the formation of a semiconductor circuit, according to various embodiments.
FIG. 6B is a first vertical cross-sectional view of the intermediate structure of FIG. 6A, according to various embodiments.
FIG. 6C is a second vertical cross-sectional view of the intermediate structure of FIG. 6A, according to various embodiments.
FIG. 6D is a third vertical cross-sectional view of the intermediate structure of FIG. 6A, according to various embodiments.

FIG. 6A is a top view of an intermediate structure 600 that may be used in the formation of a semiconductor circuit 200, FIG. 6B is a first vertical cross-sectional view of the intermediate structure 600 of FIG. 6A, FIG. 6C is a second vertical cross-sectional view of the intermediate structure 600 of FIG. 6A, and FIG. 6D is a third vertical cross-sectional view of the intermediate structure 600 of FIG. 6A, according to various embodiments. The vertical planes defining the views in FIGS. 6B, 6C, and 6D are respectively indicated by the cross sections B-B', C-C', and D-D' in FIG. 6A. The intermediate structure 600 may be formed from the intermediate structure 500 of FIGS. 5A to 5D by removing the patterned photoresist 308 and depositing a third interlayer dielectric layer 304c over the intermediate structure 500 after the patterned photoresist 308 has been removed.

The third interlayer dielectric layer 304c may be formed using materials and processes described above with reference to the formation of the first interlayer dielectric layer 304a and the second interlayer dielectric layer 304b. As shown, the third interlayer dielectric layer 304c may partially or completely surround the first-conductivity-type semiconductor layer 206a. In this regard, at the processing stage of FIGS. 6A to 6D, the third interlayer dielectric layer 304c surrounds (encapsulates) the first-conductivity-type semiconductor layer 206a. However, after a planarization process (described below with reference to FIGS. 8A to 8D), the third interlayer dielectric layer 304c may only partially surround the first-conductivity-type semiconductor layer 206a. The third interlayer dielectric layer 304c may be used to protect the first-conductivity-type semiconductor layer 206a during further processing operations, as described in greater detail with reference to FIGS. 7A to 7D, below.

Figures 7A, 7B, 7C, 7D:
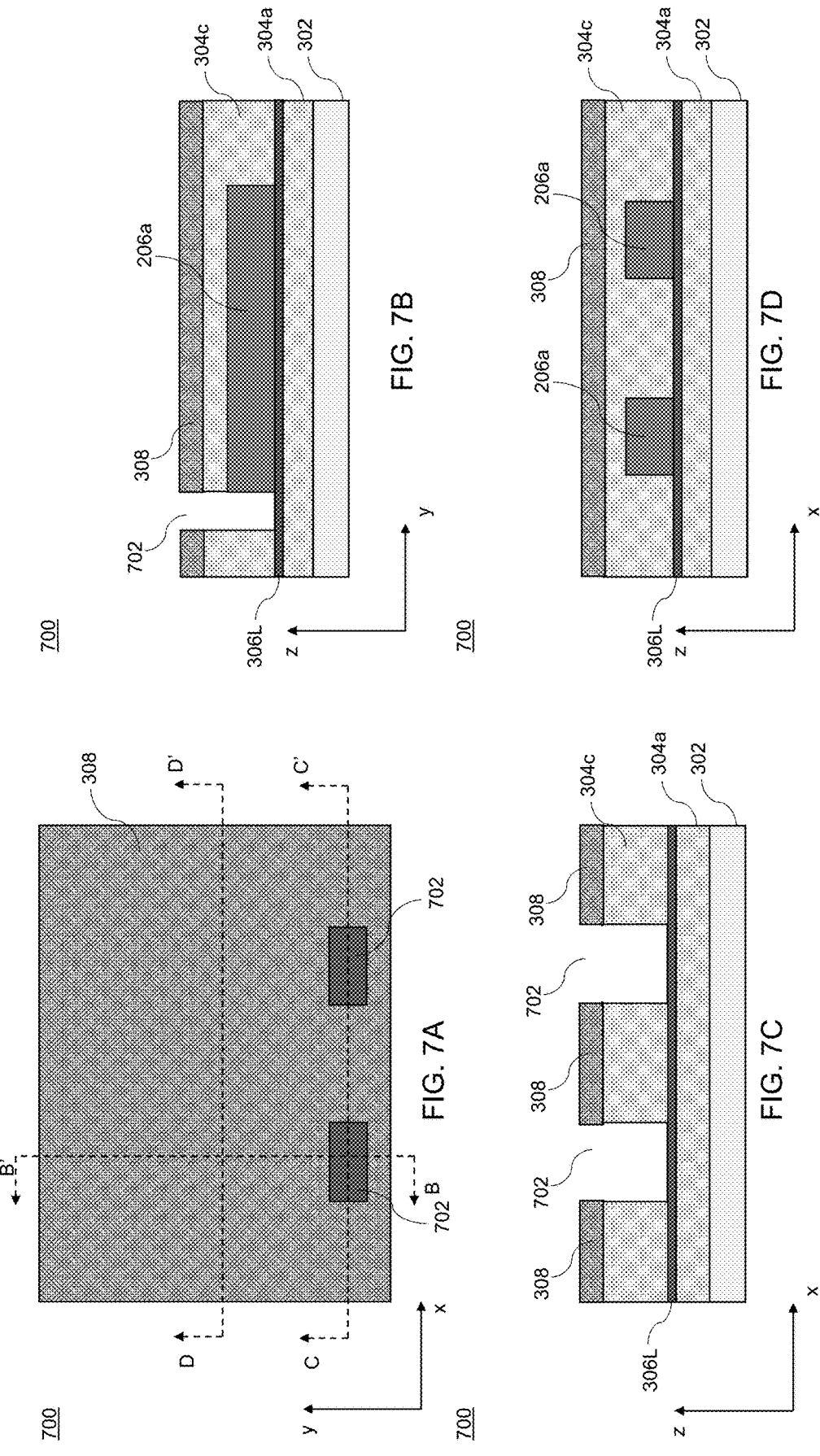
FIG. 7A is a top view of a further intermediate structure that may be used in the formation of a semiconductor circuit, according to various embodiments.
FIG. 7B is a first vertical cross-sectional view of the intermediate structure of FIG. 7A, according to various embodiments.
FIG. 7C is a second vertical cross-sectional view of the intermediate structure of FIG. 7A, according to various embodiments.
FIG. 7D is a third vertical cross-sectional view of the intermediate structure of FIG. 7A, according to various embodiments.

FIG. 7A is a top view of an intermediate structure 700 that may be used in the formation of a semiconductor circuit 200, FIG. 7B is a first vertical cross-sectional view of the intermediate structure 700 of FIG. 7A, FIG. 7C is a second vertical cross-sectional view of the intermediate structure 700 of FIG. 7A, and FIG. 7D is a third vertical cross-sectional view of the intermediate structure 700 of FIG. 7A, according to various embodiments. The vertical planes defining the views in FIGS. 7B, 7C, and 7D are respectively indicated by the cross sections B-B', C-C', and D-D' in FIG. 7A. The intermediate structure 700 may be formed from the intermediate structure 600 of FIGS. 6A to 6D by forming a patterned photoresist 308 over the intermediate structure 600 and performing an anisotropic etch process to etch portions of the intermediate structure 600 that are not masked by the patterned photoresist 308. As shown, the anisotropic etch process may generate via openings 702. An electrically conductive material may then be deposited in the via openings 702 to thereby form the first source electrode 110a, as described in greater detail with reference to FIGS. 8A to 8D, below.

FIG. 8A is a top view of an intermediate structure 800 that may be used in the formation of a semiconductor circuit 200, FIG. 8B is a first vertical cross-sectional view of the intermediate structure 800 of FIG. 8A, FIG. 8C is a second vertical cross-sectional view of the intermediate structure 800 of FIG. 8A, and FIG. 8D is a third vertical cross-sectional view of the intermediate structure 800 of FIG. 8A, according to various embodiments. The vertical planes defining the views in FIGS. 8B, 8C, and 8D are respectively indicated by the cross sections B-B', C-C', and D-D' in FIG. 8A. The intermediate structure 800 may be formed from the intermediate structure 700 of FIGS. 7A to 7D by depositing an electrically conductive material in the via openings 702, removing the patterned photoresist 308 (e.g., by ashing or by dissolution with a solvent), and by performing a planarization process (e.g., CMP) to remove excess portions of the conductive material and to remove a portion of the third interlayer dielectric layer 304c.

The electrically conductive material may include a metallic liner material and a metallic fill material. The metallic liner material may include a conductive metallic nitride or a conductive metallic carbide such as Ti, Al, TiN, TiN/W, Ti/Al/Ti, TaN, W, Cu, WN, WCN, PdCo, TiC, TaC, and/or WC. A thickness of the metallic liner material may be in a range from approximately 1 nm to approximately 10 nm, such as from approximately 3 nm to approximately 8 nm, although smaller and larger thicknesses may also be used. The metallic fill material may include W, Cu, Al, Co, Ru, Mo, Ta, Ti, TiN, alloys thereof, and/or combinations thereof.

Other suitable metallic liner and metallic fill materials within the contemplated scope of this disclosure may also be used. A thickness of the metallic fill material may be in a range from approximately 5 nm to approximately 500 nm, such as from approximately 20 nm to approximately 40 nm, although smaller and larger thicknesses may also be used. The metallic liner material and metallic fill materials may be formed by suitable deposition process, which may include one or more of a CVD process, a PVD process, an ALD process, an electroplating process, etc. Other suitable deposition processes are within the contemplated scope of disclosure.

Excess portions of the conductive material may then be removed from above a horizontal plane including the top surface of the third interlayer dielectric layer 304c by a planarization process such as CMP, although other suitable planarization processes may be used. The remaining portions of the conductive material form the first source electrode 110a. In some embodiments, the first source electrode 110a may be formed by deposition of one or more alloys of one or more of W, Mo, Co, Pd, Ti, and mixtures thereof, with or without N and/or O, deposited by chemical vapor deposition or by atomic layer deposition.

Figures 9A, 9B, 9C, 9D:
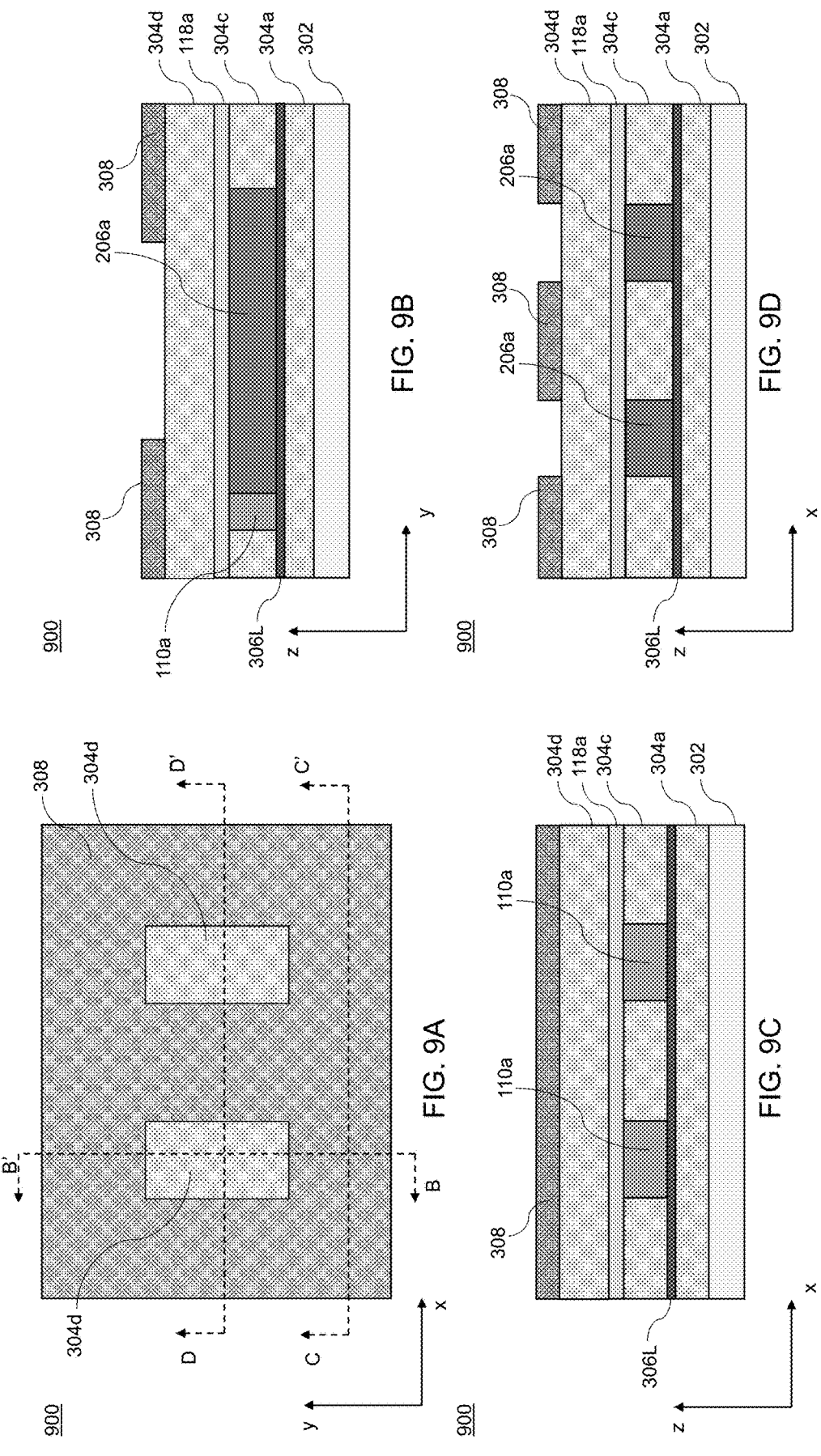
FIG. 9A is a top view of a further intermediate structure that may be used in the formation of a semiconductor circuit, according to various embodiments.
FIG. 9B is a first vertical cross-sectional view of the intermediate structure of FIG. 9A, according to various embodiments.
FIG. 9C is a second vertical cross-sectional view of the intermediate structure of FIG. 9A, according to various embodiments.
FIG. 9D is a third vertical cross-sectional view of the intermediate structure of FIG. 9A, according to various embodiments.

FIG. 9A is a top view of an intermediate structure 900 that may be used in the formation of a semiconductor circuit 200, FIG. 9B is a first vertical cross-sectional view of the intermediate structure 900 of FIG. 9A, FIG. 9C is a second vertical cross-sectional view of the intermediate structure 900 of FIG. 9A, and FIG. 9D is a third vertical cross-sectional view of the intermediate structure 900 of FIG. 9A, according to various embodiments. The vertical planes defining the views in FIGS. 9B, 9C, and 9D are respectively indicated by the cross sections B-B', C-C', and D-D' in FIG. 9A. The intermediate structure 900 may be formed from the intermediate structure 800 of FIGS. 8A to 8D by forming first gate dielectric layer 118a, a fourth interlayer dielectric layer 304d, and a patterned photoresist 308 over the intermediate structure 800 of FIGS. 8A to 8D.

The first gate dielectric layer 118a may include, but is not limited to, silicon dioxide, silicon nitride, silicon oxynitride, hafnium oxide, hafnium silicon oxide, tantalum oxide, hafnium tantalum oxide, hafnium titanium oxide, hafnium zirconium oxide, zirconium oxide, titanium oxide, aluminum oxide, hafnium dioxide-alumina, or various other insulating structures such as a multi-layer stack structure including alternating insulating layers. Other suitable dielectric materials are within the contemplated scope of disclosure. In other embodiments, the first gate dielectric layer 118a may include an alternating multi-layer structure (not shown) including silicon oxide and silicon nitride. In other embodiments, the first gate dielectric layer 118a may include a ferroelectric material.

The first gate dielectric layer 118a may be formed by any suitable technique such as ALD, CVD, PECVD, PVD, etc. A thickness of the first gate dielectric layer 118a may be in a range from approximately 2 nm to approximately 20 nm, such as from approximately 5 nm to approximately 12 nm, although other embodiments may include smaller and larger thicknesses. Following the deposition of the first gate dielectric layer 118a, the intermediate structure 900 may optionally be annealed. The optional annealing process may be performed at a temperature in a range from 200° C. to 400° C. using a rapid thermal annealing or furnace annealing process. The annealing may be performed in an environment of nitrogen, oxygen, or a mixture thereof.

The fourth interlayer dielectric layer 304d may be formed using materials and processes described above with reference to the formation of the first interlayer dielectric layer 304a, the second interlayer dielectric layer 304b, and the third interlayer dielectric layer 304c. In this regard, the fourth interlayer dielectric layer 304d may be formed by depositing an interlayer dielectric layer followed by performing a planarization process (e.g., CMP) to remove a portion of the interlayer dielectric above a top surface of the fourth interlayer dielectric layer 304d. The patterned photoresist 308 may also be formed using processes described above. In this regard, a uniform layer of photoresist (not shown) may be deposited over a top surface of the fourth interlayer dielectric layer 304d. The uniform layer of photoresist may then be patterned using lithographic techniques to form the patterned photoresist 308. The patterned photoresist may then be used to pattern the fourth interlayer dielectric layer 304d to form gate openings (not shown) that may be used to form the gate electrode 116, as described in greater detail with reference to FIGS. 10A to 10D, below.

FIG. 10A is a top view of an intermediate structure 1000 that may be used in the formation of a semiconductor circuit 200, FIG. 10B is a first vertical cross-sectional view of the intermediate structure 1000 of FIG. 10A, FIG. 10C is a second vertical cross-sectional view of the intermediate structure 1000 of FIG. 10A, and FIG. 10D is a third vertical cross-sectional view of the intermediate structure 1000 of FIG. 10A, according to various embodiments. The vertical planes defining the views in FIGS. 10B, 10C, and 10D are respectively indicated by the cross sections B-B', C-C', and D-D' in FIG. 10A. The intermediate structure 1000 may be formed from the intermediate structure 900 of FIGS. 9A to 9D by patterning the fourth interlayer dielectric layer 304d to form gate openings (not shown), depositing an electrically conductive material into the gate openings to thereby form the gate electrode 116, and planarizing the resulting structure.

The electrically conductive material may include a metallic liner material and a metallic fill material. The metallic liner material may include a conductive metallic nitride or a conductive metallic carbide such as Ti, Al, TiN, TiN/W, Ti/Al/Ti, TaN, W, Cu, WN, WCN, PdCo, TiC, TaC, and/or WC. A thickness of the metallic liner material may be in a range from approximately 1 nm to approximately 10 nm, such as from approximately 3 nm to approximately 8 nm, although smaller and larger thicknesses may also be used. The metallic fill material may include W, Cu, Al, Co, Ru, Mo, Ta, Ti, TiN, alloys thereof, and/or combinations thereof. Other suitable metallic liner and metallic fill materials within the contemplated scope of this disclosure may also be used. A thickness of the metallic fill material may be in a range from approximately 5 nm to approximately 500 nm, such as from approximately 20 nm to approximately 40 nm, although smaller and larger thicknesses may also be used. The metallic liner material and metallic fill materials may be formed by suitable deposition process, which may include one or more of a CVD process, a PVD process, an ALD process, an electroplating process, etc. Other suitable deposition processes are within the contemplated scope of disclosure.

Excess portions of the conductive material may then be removed from above a horizontal plane including the top surface of the fourth interlayer dielectric layer 304d by a planarization process such as CMP, although other suitable planarization processes may be used. The remaining portions of the conductive material form the gate electrode 116. In some embodiments, the gate electrode 116 may be formed by deposition of one or more alloys of one or more of W, Mo, Co, Pd, Ti, and mixtures thereof, with or without N and/or O, deposited by chemical vapor deposition or by atomic layer deposition.

Figures 11A, 11B, 11C, 11D:
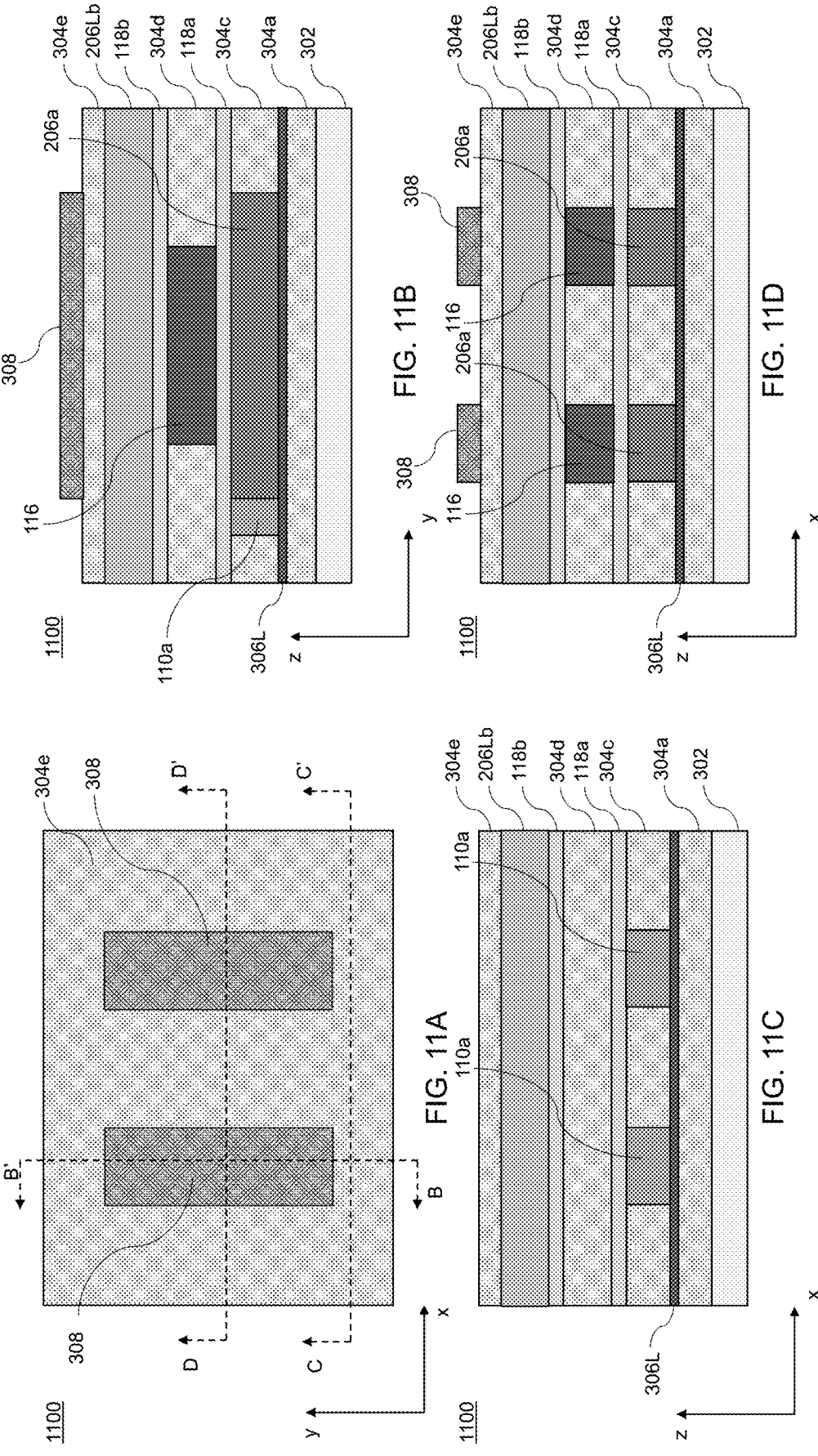
FIG. 11A is a top view of a further intermediate structure that may be used in the formation of a semiconductor circuit, according to various embodiments.
FIG. 11B is a first vertical cross-sectional view of the intermediate structure of FIG. 11A, according to various embodiments.
FIG. 11C is a second vertical cross-sectional view of the intermediate structure of FIG. 11A, according to various embodiments.
FIG. 11D is a third vertical cross-sectional view of the intermediate structure of FIG. 11A, according to various embodiments.

FIG. 11A is a top view of an intermediate structure 1100 that may be used in the formation of a semiconductor circuit 200, FIG. 11B is a first vertical cross-sectional view of the intermediate structure 1100 of FIG. 11A, FIG. 11C is a second vertical cross-sectional view of the intermediate structure 1100 of FIG. 11A, and FIG. 11D is a third vertical cross-sectional view of the intermediate structure 1100 of FIG. 11A, according to various embodiments. The vertical planes defining the views in FIGS. 11B, 11C, and 11D are respectively indicated by the cross sections B-B', C-C', and D-D' in FIG. 11A. The intermediate structure 1100 may be formed from the intermediate structure 1000 of FIGS. 10A to 10D by forming a second gate dielectric layer 118b, a second oxide semiconductor layer 206Lb, a fifth interlayer dielectric layer 304e, and a patterned photoresist 308 over the intermediate structure 1000 of FIGS. 10A to 10D.

The second gate dielectric layer 118b and the fifth interlayer dielectric layer 304e may be formed using materials and processes described above with reference to the first gate dielectric layer 118a and the first through fourth interlayer dielectric layers (304a, 304b, 304c, 304d). The second oxide semiconductor layer 206Lb may be second-conductivity-type semiconductor layer such as an n-type semiconducting material including, but not limited to, amorphous silicon, $Al_2O_5Zn_2$ doped ZnO, InGaZnO, InGaO, InWO, InZnO, InSnO, $Ga_2O_3$, ZnO, GaO, InO, $In_2O_3$, InZnO, ZnO, TiOx, and alloys thereof. Other suitable semiconducting materials are within the contemplated scope of disclosure. For example, in various embodiments, the oxide semiconductor layer 206Lb may include a composition given by $In_x$ $Ga_y$ $Zn_z$ MO, wherein $0<x<1$; $0\leq y\leq 1$; $0\leq z\leq 1$; and M is one of Ti, Al, Ag, Ce, and Sn. The oxide semiconductor layer 206Lb may be formed by any suitable method such as ALD, CVD, PECVD, PVD, etc.

A thickness of the second oxide semiconductor layer 206Lb may be in a range from approximately 2 nm to approximately 50 nm, such as from approximately 5 nm to approximately 15 nm, although other embodiments may include smaller and larger thicknesses. Following the deposition of the second oxide semiconductor layer 206Lb, the intermediate structure 1100 may optionally be annealed. The optional annealing process may be performed at a temperature in a range from 200° C. to 400° C. using a rapid thermal annealing or furnace annealing process. The annealing may be performed in an environment of nitrogen, oxygen, or a mixture thereof.

Figures 12A, 12B, 12C, 12D:
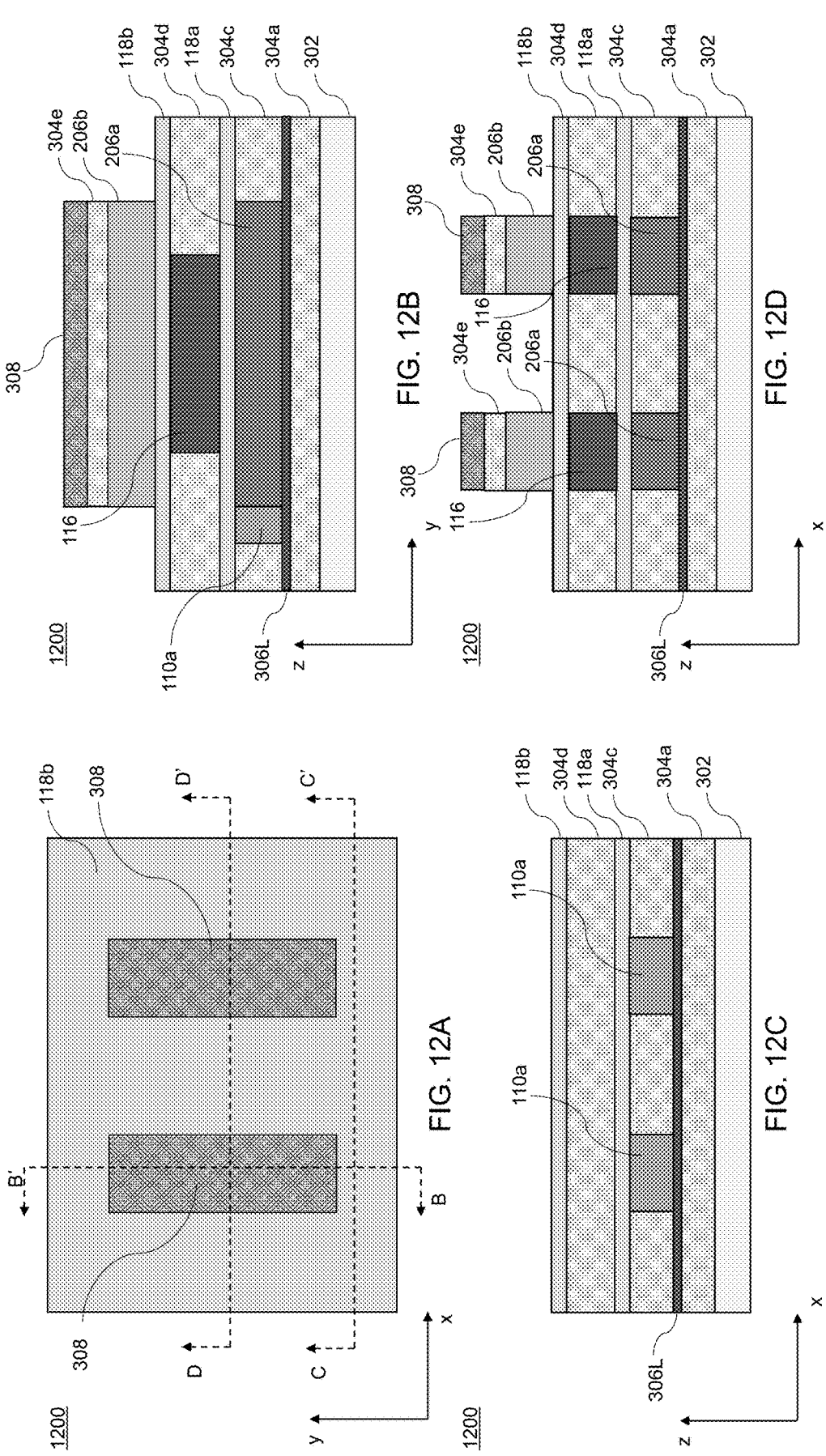
FIG. 12A is a top view of a further intermediate structure that may be used in the formation of a semiconductor circuit, according to various embodiments.
FIG. 12B is a first vertical cross-sectional view of the intermediate structure of FIG. 12A, according to various embodiments.
FIG. 12C is a second vertical cross-sectional view of the intermediate structure of FIG. 12A, according to various embodiments.
FIG. 12D is a third vertical cross-sectional view of the intermediate structure of FIG. 12A, according to various embodiments.

FIG. 12A is a top view of an intermediate structure 1200 that may be used in the formation of a semiconductor circuit 200, FIG. 12B is a first vertical cross-sectional view of the intermediate structure 1200 of FIG. 12A, FIG. 12C is a second vertical cross-sectional view of the intermediate structure 1200 of FIG. 12A, and FIG. 12D is a third vertical cross-sectional view of the intermediate structure 1200 of FIG. 12A, according to various embodiments. The vertical planes defining the views in FIGS. 12B, 12C, and 12D are respectively indicated by the cross sections B-B', C-C', and D-D' in FIG. 12A. The intermediate structure 1200 may be formed from the intermediate structure 1100 of FIGS. 11A to 11D by performing an anisotropic etch process to remove portions of the second oxide semiconductor layer 206Lb and the fifth interlayer dielectric layer 304e that are not masked by the patterned photoresist 308. The resulting intermediate structure 1200 includes the patterned second-conductivity-type semiconductor layer 206b described above with reference to FIGS. 2A, 2B, and 2D along with a remaining portion of the fifth interlayer dielectric layer 304e. The patterned photoresist 308 may then be removed by ashing or by dissolution with a solvent.

FIG. 13A is a top view of an intermediate structure 1300 that may be used in the formation of a semiconductor circuit 200, FIG. 13B is a first vertical cross-sectional view of the intermediate structure 1300 of FIG. 13A, FIG. 13C is a second vertical cross-sectional view of the intermediate structure 1300 of FIG. 13A, and FIG. 13D is a third vertical cross-sectional view of the intermediate structure 1300 of FIG. 13A, according to various embodiments. The vertical planes defining the views in FIGS. 13B, 13C, and 13D are respectively indicated by the cross sections B-B', C-C', and D-D' in FIG. 13A. The intermediate structure 1300 may be formed from the intermediate structure 1200 of FIGS. 12A to 12D by removing the patterned photoresist 308 and depositing a sixth interlayer dielectric layer 304f over the intermediate structure 1200 after the patterned photoresist 308 has been removed.

The sixth interlayer dielectric layer 304f may be formed using materials and processes described above with reference to the formation of the first through fifth interlayer dielectric layers (304a, 304b, 304c, 304d, 304e). As shown, the sixth interlayer dielectric layer 304f may partially or completely surround the second-conductivity-type semiconductor layer 206b. In this regard, at the processing stage of FIGS. 13A to 13D, the sixth interlayer dielectric layer 304f completely surrounds the second-conductivity-type semiconductor layer 206b, however, after a planarization process (described below with reference to FIGS. 15A to 15D), the sixth interlayer dielectric layer 304f may only partially surround the second-conductivity-type semiconductor layer 206b. The sixth interlayer dielectric layer 304f may be used to protect the second-conductivity-type semiconductor layer 206b during further processing operations, as described in greater detail with reference to FIGS. 14A to 14D, below.

Figures 14A, 14B, 14C, 14D:
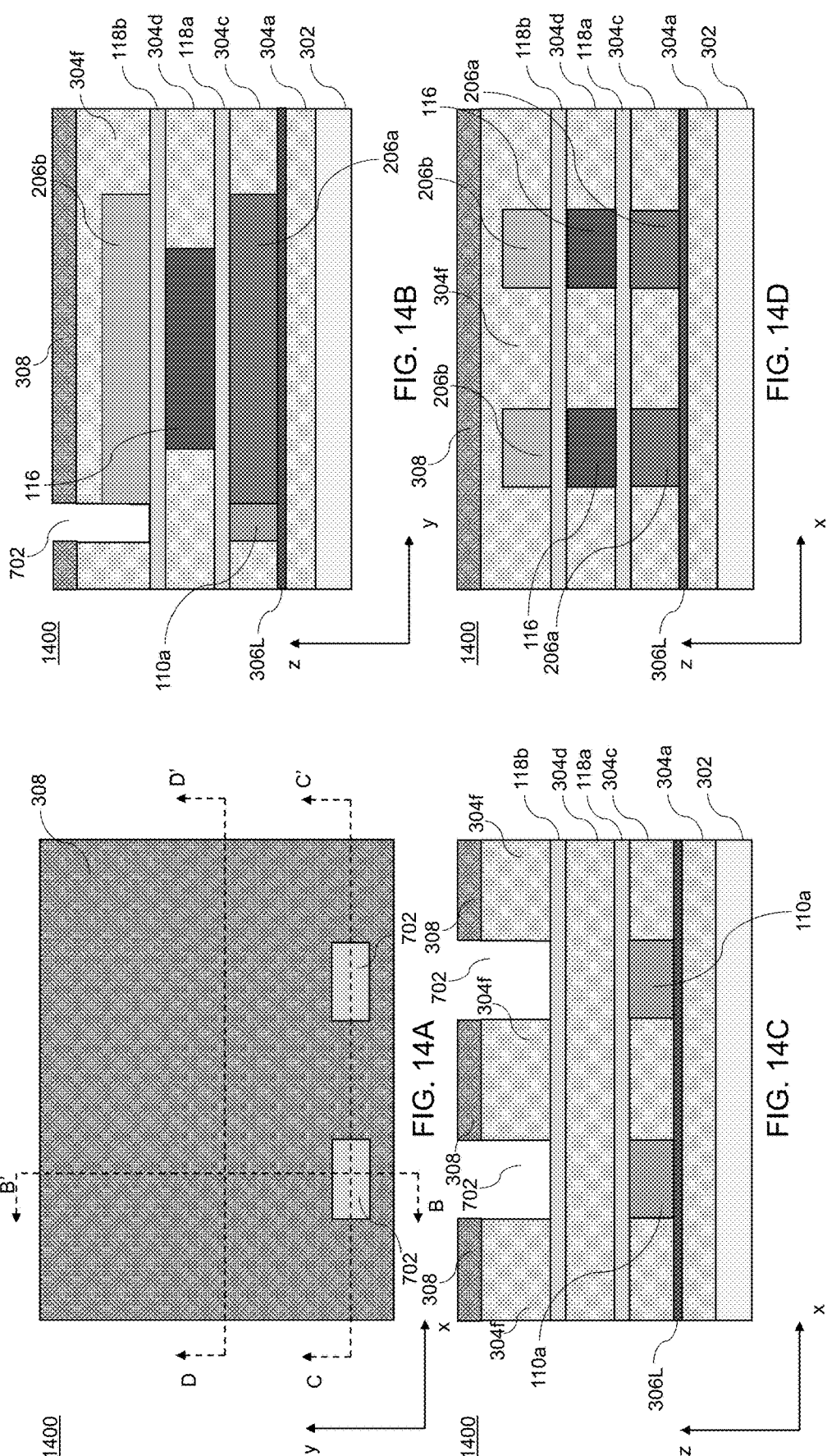
FIG. 14A is a top view of a further intermediate structure that may be used in the formation of a semiconductor circuit, according to various embodiments.
FIG. 14B is a first vertical cross-sectional view of the intermediate structure of FIG. 14A, according to various embodiments.
FIG. 14C is a second vertical cross-sectional view of the intermediate structure of FIG. 14A, according to various embodiments.
FIG. 14D is a third vertical cross-sectional view of the intermediate structure of FIG. 14A, according to various embodiments.

FIG. 14A is a top view of an intermediate structure 1400 that may be used in the formation of a semiconductor circuit 200, FIG. 14B is a first vertical cross-sectional view of the intermediate structure 1400 of FIG. 14A, FIG. 14C is a second vertical cross-sectional view of the intermediate structure 1400 of FIG. 14A, and FIG. 14D is a third vertical cross-sectional view of the intermediate structure 1400 of FIG. 14A, according to various embodiments. The vertical planes defining the views in FIGS. 14B, 14C, and 14D are respectively indicated by the cross sections B-B', C-C', and D-D' in FIG. 14A. The intermediate structure 1400 may be formed from the intermediate structure 1300 of FIGS. 13A to 13D by forming a patterned photoresist 308 over the intermediate structure 1300 and performing an anisotropic etch process to etch portions of the intermediate structure 1300 that are not masked by the patterned photoresist 308. As shown, the anisotropic etch process may generate via openings 702. An electrically conductive material may then be deposited in the via openings 702 to thereby form the second source electrode 110b (e.g., see FIGS. 2A, 2B, and 2D), as described in greater detail with reference to FIGS. 15A to 15D, below.

Figures 15A, 15B, 15C, 15D:
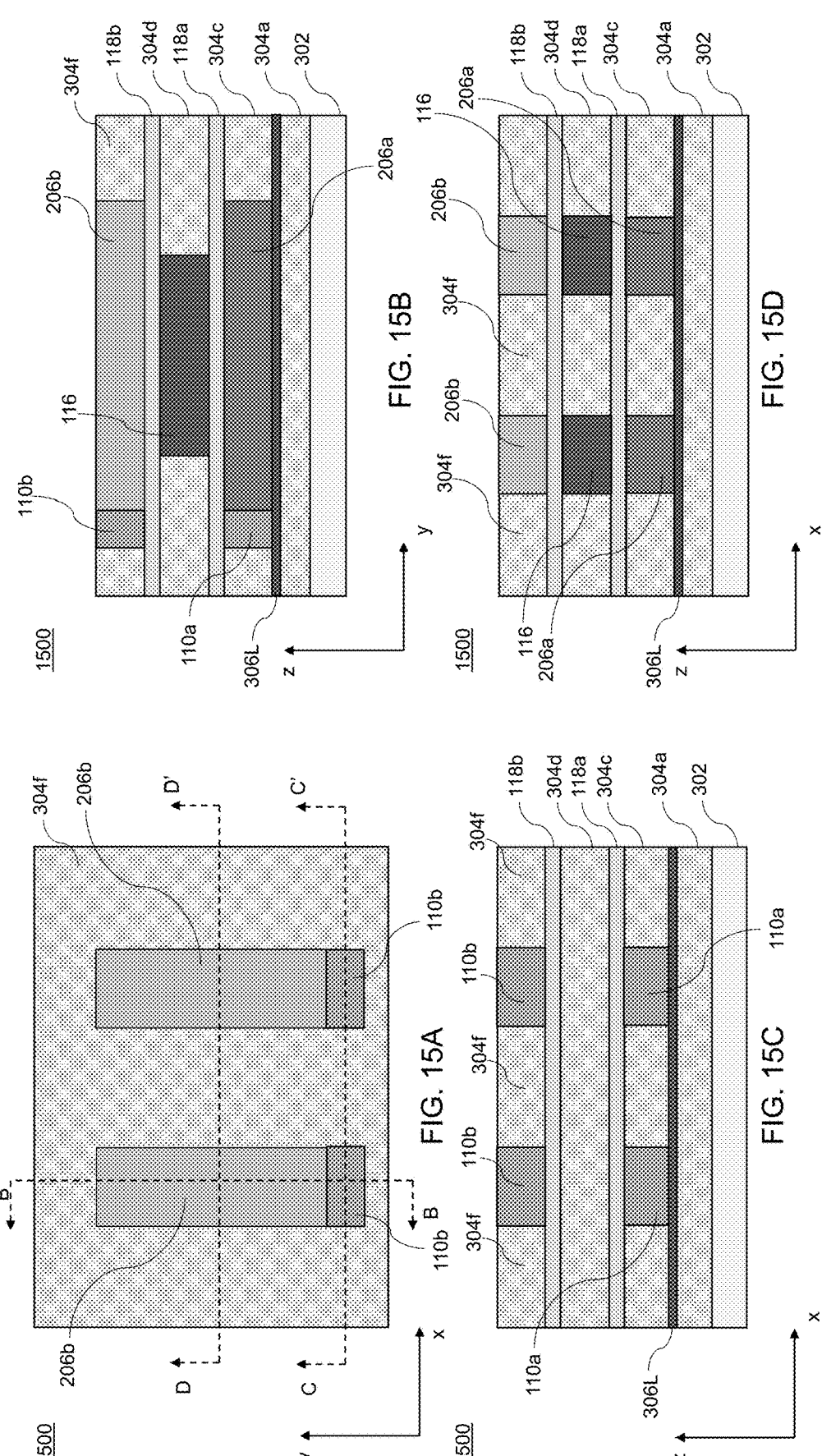
FIG. 15A is a top view of a further intermediate structure that may be used in the formation of a semiconductor circuit, according to various embodiments.
FIG. 15B is a first vertical cross-sectional view of the intermediate structure of FIG. 15A, according to various embodiments.
FIG. 15C is a second vertical cross-sectional view of the intermediate structure of FIG. 15A, according to various embodiments.
FIG. 15D is a third vertical cross-sectional view of the intermediate structure of FIG. 15A, according to various embodiments.

FIG. 15A is a top view of an intermediate structure 1500 that may be used in the formation of a semiconductor circuit 200, FIG. 15B is a first vertical cross-sectional view of the intermediate structure 1500 of FIG. 15A, FIG. 15C is a second vertical cross-sectional view of the intermediate structure 1500 of FIG. 15A, and FIG. 15D is a third vertical cross-sectional view of the intermediate structure 1500 of FIG. 15A, according to various embodiments. The vertical planes defining the views in FIGS. 15B, 15C, and 15D are respectively indicated by the cross sections B-B', C-C', and D-D' in FIG. 15A. The intermediate structure 1500 may be formed from the intermediate structure 1400 of FIGS. 14A to 14D by depositing an electrically conductive material in the via openings 702, removing the patterned photoresist 308 (e.g., by ashing or by dissolution with a solvent), and by performing a planarization process (e.g., CMP) to remove excess portions of the conductive material and to remove a portion of the sixth interlayer dielectric layer 304f.

The electrically conductive material may include a metallic liner material and a metallic fill material and may include similar materials to those described above with reference to the formation of the first source electrode 110a (e.g., see FIGS. 8A to 8D and related description, above). Excess portions of the conductive material may then be removed from above a horizontal plane including the top surface of the sixth interlayer dielectric layer 304f by a planarization process such as CMP, although other suitable planarization processes may be used. The remaining portions of the conductive material form the second source electrode 110b (e.g., see FIGS. 2A, 2B, and 2D).

Figures 16A, 16B, 16C, 16D:
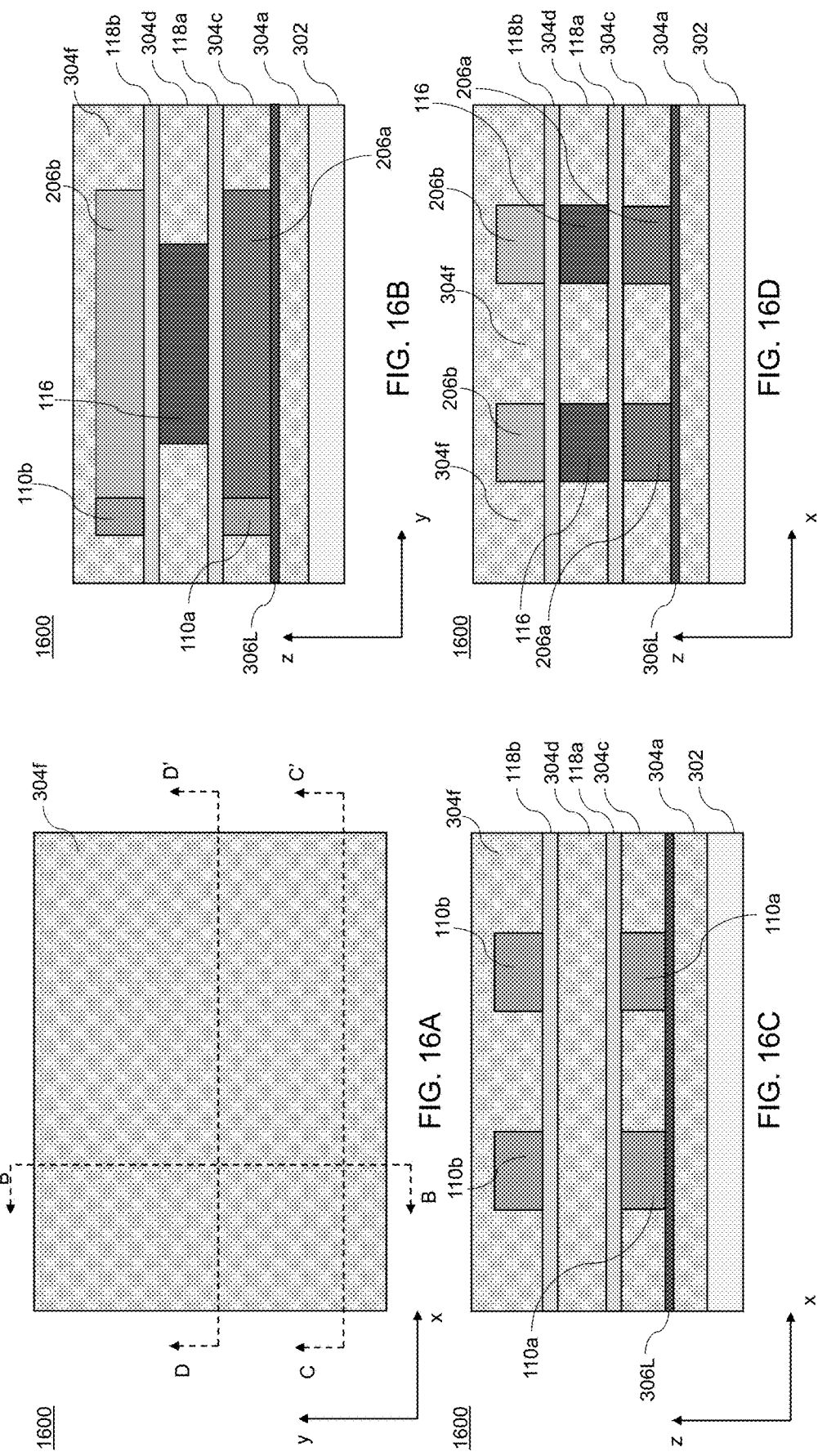
FIG. 16A is a top view of a further intermediate structure that may be used in the formation of a semiconductor circuit, according to various embodiments.
FIG. 16B is a first vertical cross-sectional view of the intermediate structure of FIG. 16A, according to various embodiments.
FIG. 16C is a second vertical cross-sectional view of the intermediate structure of FIG. 16A, according to various embodiments.
FIG. 16D is a third vertical cross-sectional view of the intermediate structure of FIG. 16A, according to various embodiments.

FIG. 16A is a top view of an intermediate structure 1600 that may be used in the formation of a semiconductor circuit 200, FIG. 16B is a first vertical cross-sectional view of the intermediate structure 1600 of FIG. 16A, FIG. 16C is a second vertical cross-sectional view of the intermediate structure 1600 of FIG. 16A, and FIG. 16D is a third vertical cross-sectional view of the intermediate structure 1600 of FIG. 16A, according to various embodiments. The vertical planes defining the views in FIGS. 16B, 16C, and 16D are respectively indicated by the cross sections B-B', C-C', and D-D' in FIG. 16A. The intermediate structure 1600 may be formed from the intermediate structure 1500 of FIGS. 15A to 15D by depositing additional interlayer dielectric material to increase a thickness of the sixth interlayer dielectric layer 304f over the intermediate structure 1500.

As described above, the sixth interlayer dielectric layer 304f may partially or completely surround the second-conductivity-type semiconductor layer 206b and the second source electrode 110b. In this regard, at the processing stage of FIGS. 16A to 16D, the sixth interlayer dielectric layer 304f completely surrounds the second-conductivity-type semiconductor layer 206b and the second source electrode 110b, however, after a planarization process (described below with reference to FIGS. 18A to 18E), the sixth interlayer dielectric layer 304f may only partially surround the second-conductivity-type semiconductor layer 206b and the second source electrode 110b. The sixth interlayer dielectric layer 304f may be used to protect the second-conductivity-type semiconductor layer 206b and the second source electrode 110b during further processing operations, as described in greater detail with reference to FIGS. 17A to 17D, below.

Figure 17E:
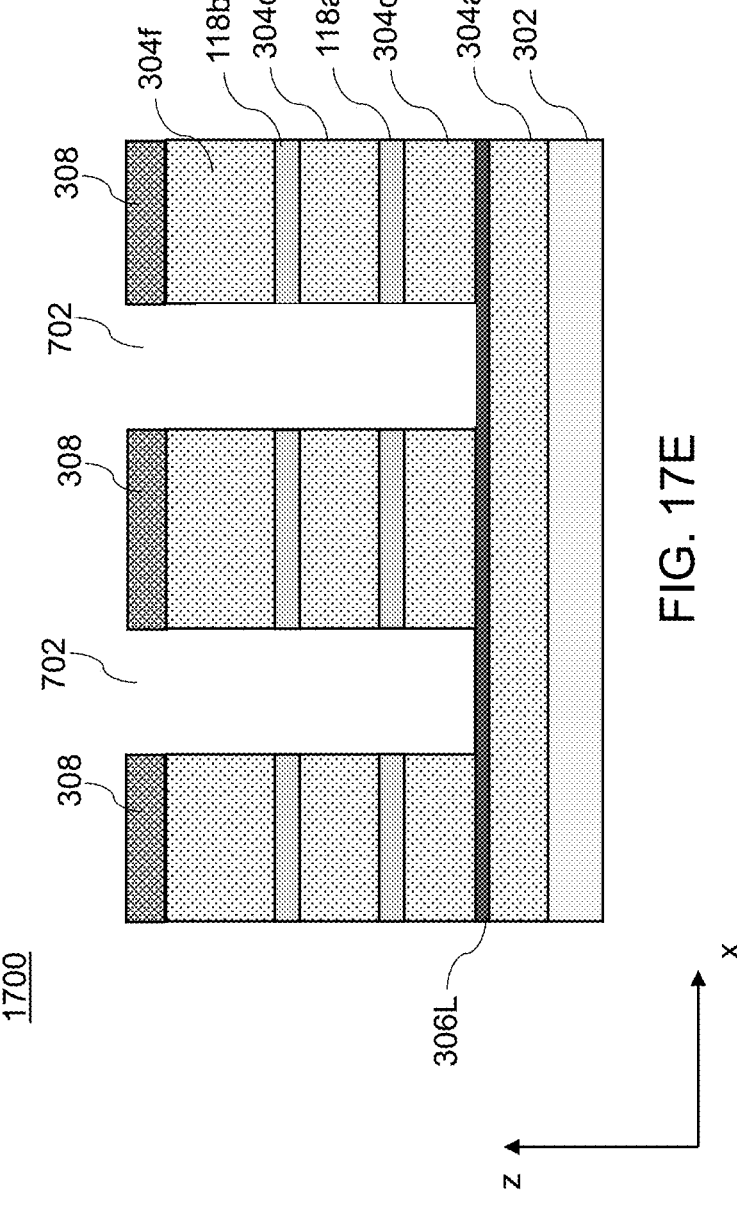
FIG. 17E is a fourth vertical cross-sectional view of the intermediate structure of FIG. 17A, according to various embodiments.

FIG. 17A is a top view of an intermediate structure 1700 that may be used in the formation of a semiconductor circuit 200, FIG. 17B is a first vertical cross-sectional view of the intermediate structure 1700 of FIG. 17A, FIG. 17C is a second vertical cross-sectional view of the intermediate structure 1700 of FIG. 17A, FIG. 17D is a third vertical cross-sectional view of the intermediate structure 1700 of FIG. 17A, and FIG. 17E is a fourth vertical cross-sectional view of the intermediate structure 1700 of FIG. 17A according to various embodiments. The vertical planes defining the views in FIGS. 17B, 17C, 17D, and 17E are respectively indicated by the cross sections B-B', C-C', D-D' and E-E' in FIG. 17A. The intermediate structure 1700 may be formed from the intermediate structure 1600 of FIGS. 16A to 16D by forming a patterned photoresist 308 over the intermediate structure 1600 and performing an anisotropic etch process to etch portions of the intermediate structure 1600 that are not masked by the patterned photoresist 308. As shown, the anisotropic etch process may generate via openings 702. An electrically conductive material may then be deposited in the via openings 702 to thereby form the shared drain electrode 112 (e.g., see FIGS. 2A, 2B, and 2D), as described in greater detail with reference to FIGS. 18A to 18E, below.

Figures 18A, 18B, 18C, 18D:
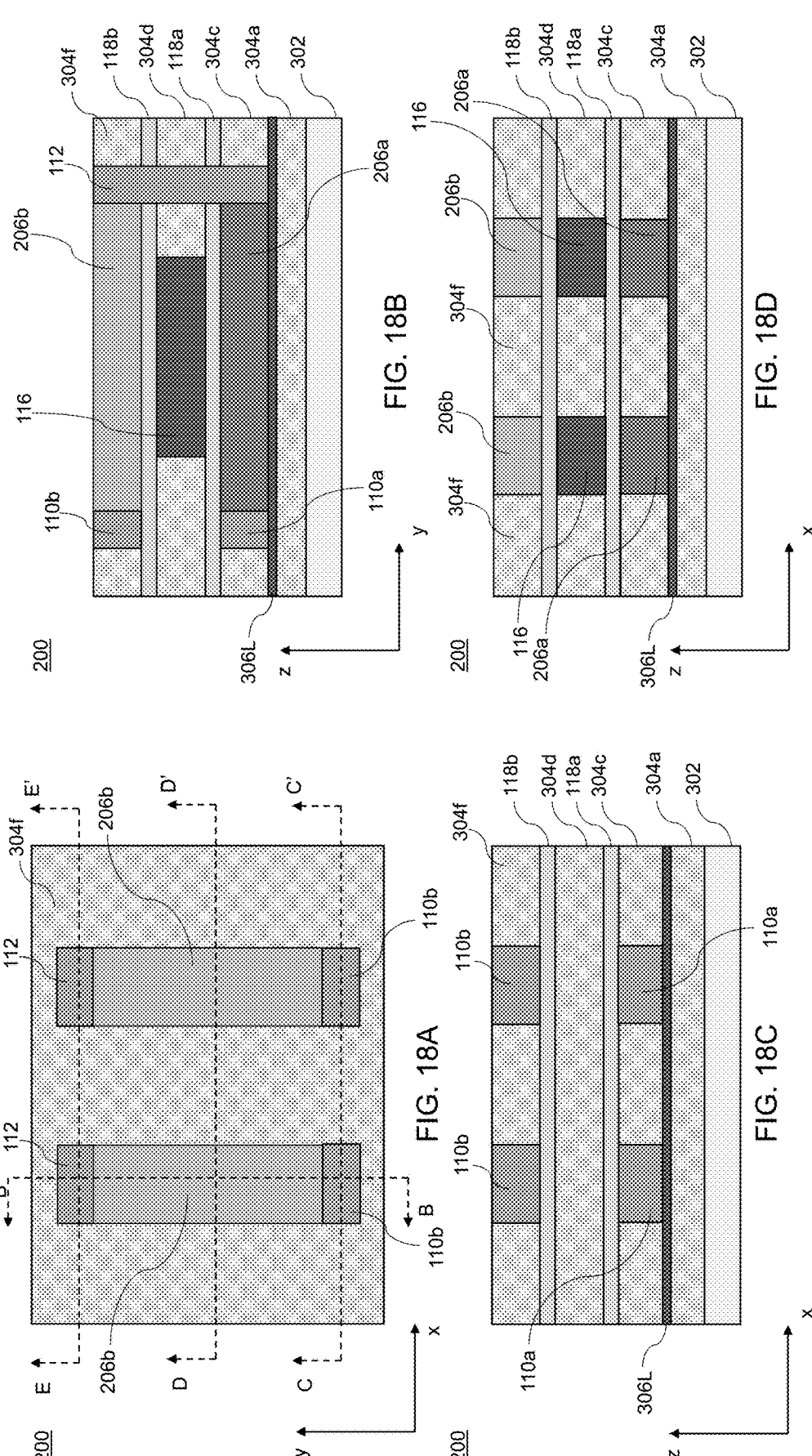
FIG. 18A is a top view of a semiconductor circuit formed by the processes described with reference to FIGS. 3A to 18E, according to various embodiments.
FIG. 18B is a first vertical cross-sectional view of the semiconductor circuit of FIG. 18A, according to various embodiments.
FIG. 18C is a second vertical cross-sectional view of the semiconductor circuit of FIG. 18A, according to various embodiments.
FIG. 18D is a third vertical cross-sectional view of the semiconductor circuit of FIG. 18A, according to various embodiments.
Figure 18E:
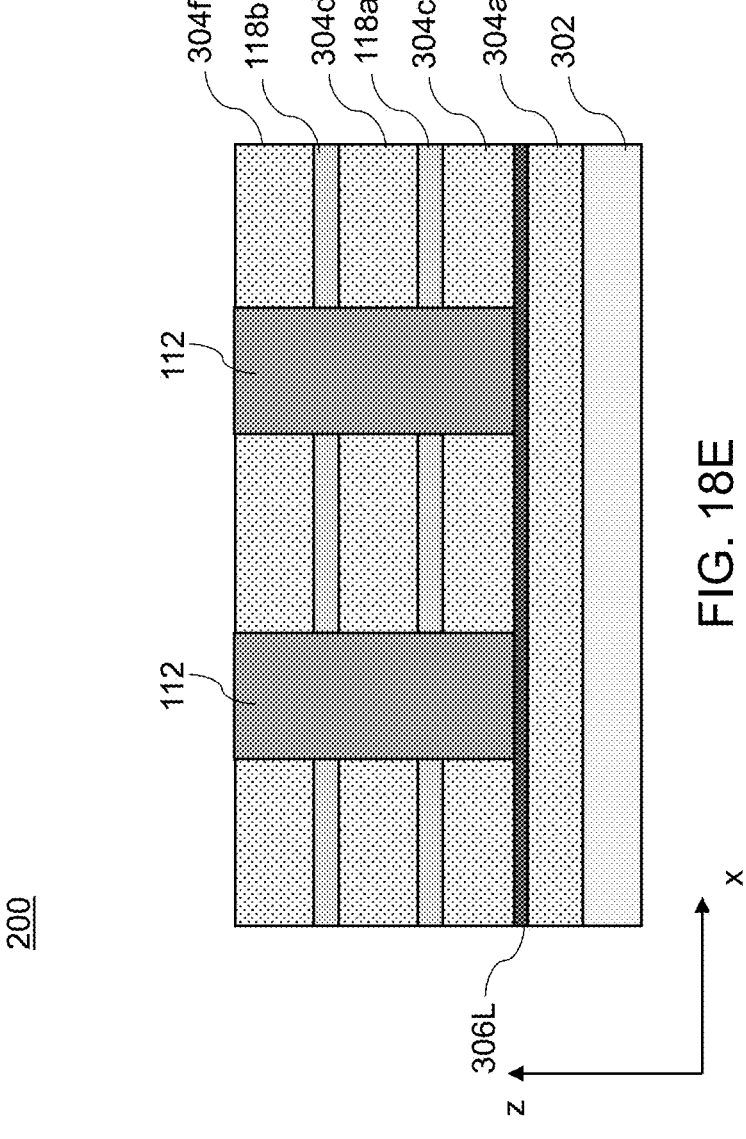
FIG. 18E is a fourth vertical cross-sectional view of the semiconductor circuit of FIG. 18A, according to various embodiments.

FIG. 18A is a top view of the semiconductor circuit 200 formed by the processes described with reference to FIGS. 3A to 18E, FIG. 18B is a first vertical cross-sectional view of the semiconductor circuit 200 of FIG. 18A, FIG. 18C is a second vertical cross-sectional view of the semiconductor circuit 200 of FIG. 18A, FIG. 18D is a third vertical cross-sectional view of the semiconductor circuit 200 of FIG. 18A, and FIG. 18E is a fourth vertical cross-sectional view of the semiconductor circuit 200 of FIG. 18A, according to various embodiments. The semiconductor circuit 200 may be formed from the intermediate structure 1700 of FIGS. 17A to 17D by depositing an electrically conductive material in the via openings 702, removing the patterned photoresist 308 (e.g., by ashing or by dissolution with a solvent), and by performing a planarization process (e.g., CMP) to remove excess portions of the conductive material and to remove a portion of the sixth interlayer dielectric layer 304f.

The electrically conductive material may include a metallic liner material and a metallic fill material and may include similar materials as those described above with reference to the formation of the first source electrode 110a (e.g., see FIGS. 8A to 8D and related description, above) and the second source electrode 110b (e.g., see FIGS. 15A to 15D and related description, above). Excess portions of the conductive material may then be removed from above a horizontal plane including the top surface of the sixth interlayer dielectric layer 304f by a planarization process such as CMP, although other suitable planarization processes may be used. The remaining portions of the conductive material form the shared drain electrode 112 (e.g., see FIGS. 2A, 2B, and 2D).

Figures 19A, 19B, 19C, 19D:
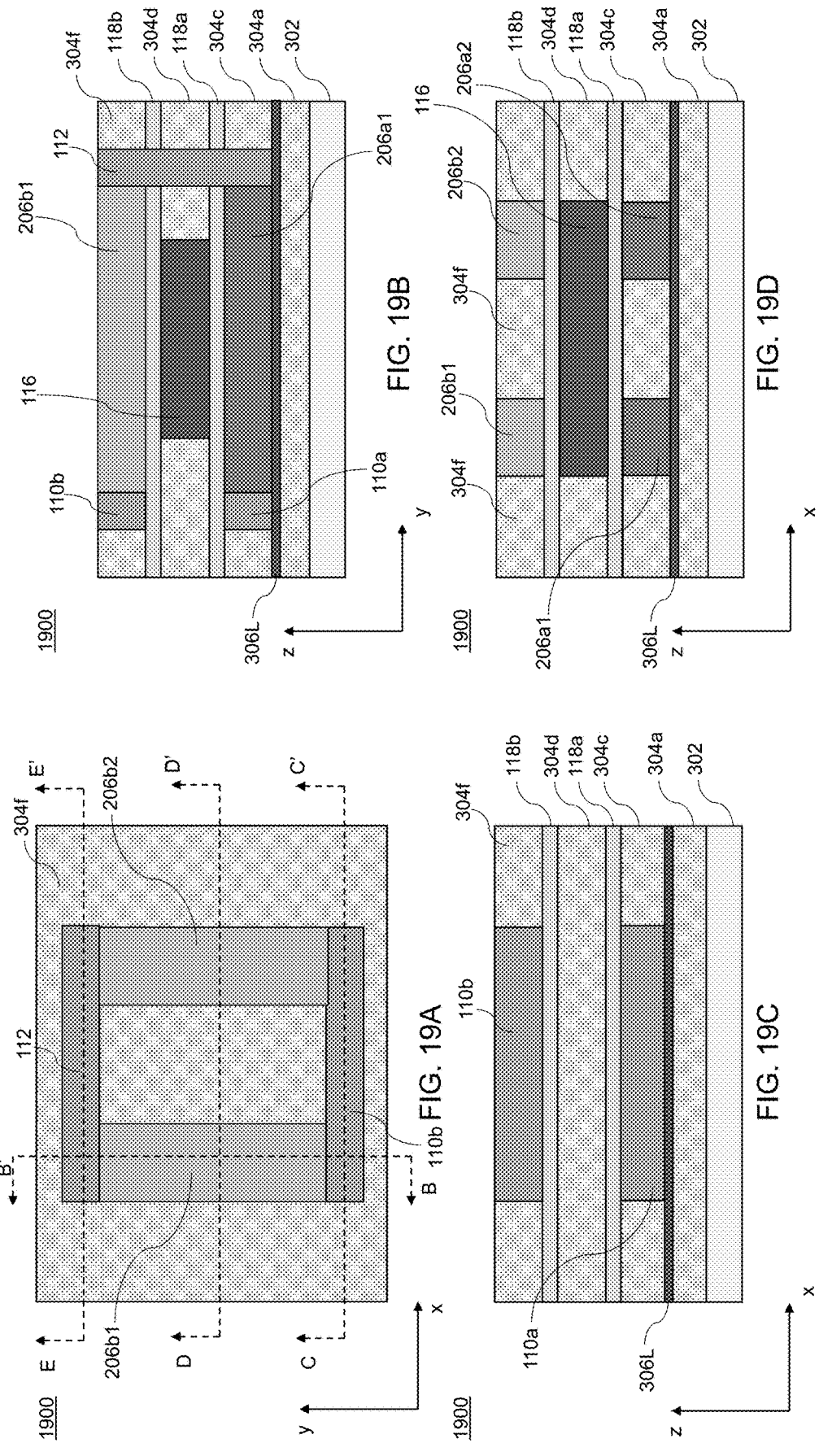
FIG. 19A is a top view of a further embodiment semiconductor circuit that may be formed by processes similar to those described above with reference to FIGS. 3A to 18E, according to various embodiments.
FIG. 19B is a first vertical cross-sectional view of the semiconductor circuit of FIG. 19A, according to various embodiments.
FIG. 19C is a second vertical cross-sectional view of the semiconductor circuit of FIG. 19A, according to various embodiments.
FIG. 19D is a third vertical cross-sectional view of the semiconductor circuit of FIG. 19A, according to various embodiments.
Figure 19E:
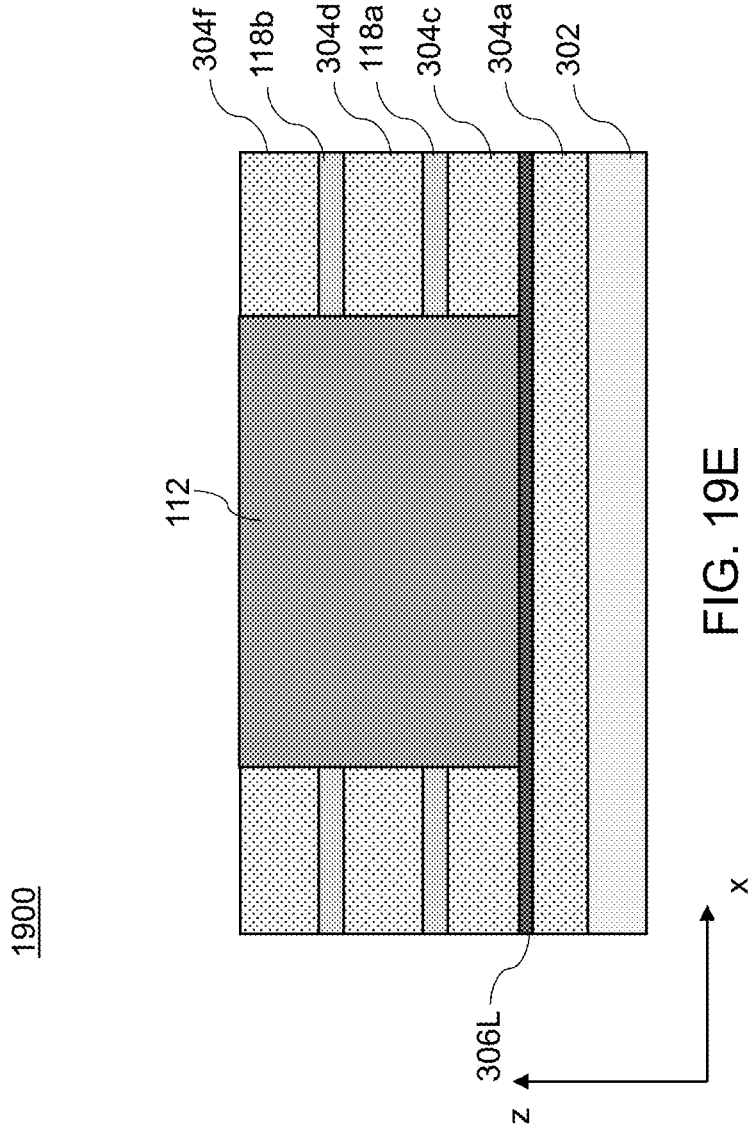
FIG. 19E is a fourth vertical cross-sectional view of the semiconductor circuit of FIG. 19A, according to various embodiments.

FIG. 19A is a top view of a further embodiment semiconductor circuit 1900 that may be formed by the processes similar to those described above with reference to FIGS. 3A to 18E, FIG. 19B is a first vertical cross-sectional view of the semiconductor circuit 1900 of FIG. 19A, FIG. 19C is a second vertical cross-sectional view of the semiconductor circuit 1900 of FIG. 19A, FIG. 19D is a third vertical cross-sectional view of the semiconductor circuit 1900 of FIG. 19A, and FIG. 19E is a fourth vertical cross-sectional view of the semiconductor circuit 1900 of FIG. 19A, according to various embodiments. In the embodiment semiconductor circuit 1900, two neighboring p-type semiconductor layers (e.g., see 206a1 206a2 in FIG. 19D) may share a common first source electrode 110a (e.g., see FIG. 19C) and a shared drain electrode 112 (e.g., see FIG. 19A). Similarly, two neighboring n-type semiconductor layers (e.g., see 206b1 and 206b2 in FIG. 19D) may share a common second source electrode 110b (e.g., see FIG. 19C) and the shared drain electrode 112 (e.g., see FIG. 19A). Also, as shown in FIG. 19D, the gate electrode 116 may extend between the neighboring two neighboring p-type semiconductor layers (206a1, 206a2) and the two neighboring n-type semiconductor layers (206b1, 206b2).

The semiconductor circuit 1900 may thus include a pFET 216 (e.g., see FIG. 2C) that includes parallel p-type conduction channels provided by the two neighboring p-type semiconductor layers (206a1, 206a2), which are electrically coupled to the shared first source electrode 110a, the shared drain electrode 112, and the shared gate electrode 116. Similarly, the semiconductor circuit 1900 may include an nFET 218 that may include parallel n-type conduction channels provided by the neighboring n-type semiconductor layers (206b1, 206b2), which are electrically coupled to the shared second source electrode 110b, the shared drain electrode 112, and the shared gate electrode 116. Various other embodiments may include a pFET 216 and an nFET 218 having additional numbers of parallel conduction channels. For example, some embodiments may include a number N of parallel conduction channels, where N=3, 4, etc. Embodiments such as the semiconductor circuit 1900 having multiple conduction channels may allow additional circuit design flexibility in various circumstances.

FIG. 20 is a flowchart illustrating operations of a method 2000 of forming a semiconductor circuit (200, 1900), according to various embodiments. In operation 2002, the method 2000 may include forming a first-conductivity-type semiconductor layer (e.g., a p-type semiconductor layer 206a) over an interlayer dielectric (e.g., a substrate 302 such as an interlayer dielectric (136, 138, 140, 304a to 304f) or insulating matrix layer 150). In operation 2004, the method 2000 may include forming a first source electrode 110a in electrical contact with the first-conductivity-type semiconductor layer 206a. In operation 2006, the method 2000 may include forming a first gate dielectric layer 118a over the first-conductivity-type semiconductor layer 206a. In operation 2008, the method 2000 may include forming a gate electrode 116 over the first gate dielectric layer 118a. In operation 2010, the method 2000 may include forming a second gate dielectric layer 118b over the gate electrode 116. In operation 2012, the method 2000 may include forming a second-conductivity-type semiconductor layer (e.g., an n-type semiconductor layer 206b) over the second gate dielectric layer 118b. In operation 2014, the method 2000 may include forming a second source electrode 110b in electrical contact with the second-conductivity-type semiconductor layer 206b. In operation 2016, the method 2000 may include forming a shared drain electrode 112 in electrical contact with the first-conductivity-type semiconductor layer 206a and the second-conductivity-type semiconductor layer 206b.

In further embodiments, the method 2000 may further include configuring the semiconductor circuit (200, 1900) as an inverter circuit 200c (e.g., see FIG. 2C) by performing operations including electrically connecting the first source electrode 110a to a voltage supply 208 and the second source electrode 110b to a ground voltage terminal 210, electrically connecting the gate electrode 116 to an input signal terminal 212, and electrically connecting the shared drain electrode 112 to an output signal terminal 214.

In various embodiments, the method 2000 may further include forming one of the first-conductivity-type semiconductor layer 206a and the second-conductivity-type semiconductor layer 206b to include an n-type semiconductor layer including at least one of amorphous silicon, $Al_2O_5Zn_2$ doped ZnO, InGaZnO, InGaO, InWO, InZnO, InSnO, $Ga_2O_3$, ZnO, GaO, InO, $In_2O_3$, InZnO, ZnO, TiOx, and alloys thereof; and forming the other of the first-conductivity-type semiconductor layer 206a and the second-conductivity-type semiconductor layer 206b to include a p-type semiconductor layer including at least one of NiO, SnO, $Cu_2O$, etc.

In other embodiments, the method 2000 may further include forming one or more of the first gate dielectric layer 118a and the second gate dielectric layer 118b to include at least one of silicon oxide, aluminum oxide, hafnium oxide, hafnium lanthanum oxide, hafnium silicon oxide, hafnium tantalum oxide, hafnium titanium oxide, hafnium zirconium oxide, zirconium oxide, titanium oxide, tantalum oxide, and hafnium dioxide-alumina; forming one or more of the first source electrode 110a, the second source electrode 110b, and the shared drain electrode 112 to include one or more of TiN, W, WN, WCN, Co, PdCo, Mo, Cu, TaN, Ti, and Al; and forming a further interlayer dielectric layer (e.g., the fourth interlayer dielectric layer 304d) that partially surrounds the gate electrode 116.

Referring to all drawings and according to various embodiments of the present disclosure, an inverter circuit (200, 200c, 1900) is provided. The inverter circuit (200, 200c, 1900) may include a first-conductivity-type semiconductor layer 206a disposed over an interlayer dielectric layer (e.g., a substrate 302 such as an interlayer dielectric (136, 138, 140, 304a to 304f) or insulating matrix layer 150), a gate electrode 116 disposed over the first-conductivity-type semiconductor layer 206a, a second-conductivity-type semiconductor layer 206b disposed over the gate electrode 116, a first gate dielectric layer 118a disposed between the first-conductivity-type semiconductor layer 206a and the gate electrode 116, and a second gate dielectric layer 118b disposed between the gate electrode 116 and the second-conductivity-type semiconductor layer 206b. The inverter circuit (200, 200c, 1900) may further include a first source electrode 110a that is in contact with the first-conductivity-type semiconductor layer 206a, a second source electrode 110b that is in contact with the second-conductivity-type semiconductor layer 206b, and a shared drain electrode that is in contact with the first-conductivity-type semiconductor layer and the second-conductivity-type semiconductor layer.

The interlayer dielectric layer (136, 138, 140, 150, 302, 304a to 304f) may include a horizontal interface and the gate electrode 116 may include a first surface 117a that is adjacent to the first-conductivity-type semiconductor layer 206a and is parallel to the horizontal interface of the interlayer dielectric layer (136, 138, 140, 150, 302, 304a to 304f). The gate electrode 116 may further include a second surface 117b that is adjacent to the second-conductivity-type semiconductor layer 206b and is also parallel to the horizontal interface of the interlayer dielectric layer (136, 138, 140, 150, 302, 304a to 304f). The first-conductivity-type semiconductor layer 206a may include a first channel layer 119a disposed along a first horizontal plane 121a that is adjacent to the first surface 117a of the gate electrode 116 and the second-conductivity-type semiconductor layer 206b may include a second channel layer 119b disposed along a second horizontal plane 121b that is adjacent to the second surface 117b of the gate electrode 116.

According to various embodiments, the first-conductivity-type semiconductor layer may be a p-type semiconductor layer 206a and the second-conductivity-type semiconductor layer may an n-type semiconductor layer 206b. The first source electrode 110a may be electrically connected to a voltage supply 208 and the second source electrode 110b may electrically connected to a ground voltage terminal 210, the gate electrode 116 may be electrically connected to an input signal terminal 212, and the shared drain electrode 112 may be electrically connected to an output signal terminal 214. In various embodiments, at least one of the p-type semiconductor layer 206a and the n-type semiconductor layer 206b may include metal-oxide semiconductors. Further, at least one of the p-type semiconductor layer 206a and the n-type semiconductor layer 206b may include a metal-oxide semiconductor including a multi-layer structure.

In some embodiments, the n-type semiconductor layer 206b may include an alloy including, oxygen, a group-III element, and a group-V element, or the n-type semiconductor layer may include one or more of amorphous silicon, $Al_2O_5Zn_2$ doped ZnO, InGaZnO, InGaO, InWO, InZnO, InSnO, $Ga_2O_3$, ZnO, GaO, InO, $In_2O_3$, InZnO, ZnO, TiOx, and alloys thereof. In other embodiments, the n-type semiconductor layer may include a composition given by $In_x Ga_y Zn_z$ MO, wherein 0<x<1; 0≤y≤1; 0≤z≤1; and M is one of Ti, Al, Ag, Ce, and Sn. In various embodiments, the p-type semiconductor layer may include one or more of NiO, SnO, $Cu_2O$, etc., or other p-type metal-oxide semiconductor.

The interlayer dielectric layer (136, 138, 140, 150, 302, 304a to 304f), on which the semiconductor circuit (200, 1900) may be disposed, may further include one or more electrical interconnect structures (e.g., see first metal interconnect structures (142, 144, 146, 148) in FIG. 1) and one or more of the first source electrode 110a, the second source electrode 110b, the shared drain electrode 112, and the gate electrode 116 may be electrically connected to the one or more electrical interconnect structures (142, 144, 146, 148). In various embodiments, one or more of the first gate dielectric layer 118a and the second gate dielectric layer 118b may include one or more of silicon oxide, aluminum oxide, hafnium oxide, hafnium lanthanum oxide, hafnium silicon oxide, hafnium tantalum oxide, hafnium titanium oxide, hafnium zirconium oxide, zirconium oxide, titanium oxide, tantalum oxide, and hafnium dioxide-alumina.

In certain embodiments, the semiconductor circuit (200, 1900) may include a further interlayer dielectric layer (e.g., the fourth interlayer dielectric layer 304d) partially surrounding the gate electrode 116 (e.g., see FIGS. 2A, 2B, and 2C). In certain embodiments, one or more of the first source electrode 110a, the second source electrode 110b, and the shared drain electrode 112 include one or more of TiN, W, WN, WCN, Co, PdCo, Mo, Cu, TaN, Ti, and Al. One or more of the first source electrode 110a, the second source electrode 110b, the shared drain electrode 112 may further include one or more alloys of one or more of W, Mo, Co, Pd, Ti, and mixtures thereof, with or without N and/or O, deposited by chemical vapor deposition or by atomic layer deposition.

In other embodiments, a semiconductor circuit (200, 1900) may be provided. The semiconductor circuit (200, 1900) may include a p-type metal-oxide semiconductor layer 206a disposed within an interlayer dielectric layer (e.g., a substrate 302 such as an interlayer dielectric (136, 138, 140, 304a to 304f) or insulating matrix layer 150) such that the p-type metal-oxide semiconductor layer 206a is parallel to a horizontal interface of the interlayer dielectric layer (136, 138, 140, 150, 302, 304a to 304f) and an n-type metal-oxide semiconductor layer 206b disposed within the interlayer dielectric layer (136, 138, 140, 150, 302, 304a to 304f) such that the n-type metal-oxide semiconductor layer 206b is parallel to the p-type metal-oxide semiconductor layer 206a. The semiconductor circuit (200, 1900) may further include a gate electrode 116 disposed within the interlayer dielectric layer (136, 138, 140, 150, 302, 304a to 304f) such that the gate electrode 116 is disposed between the p-type metal-oxide semiconductor layer 206a and the n-type metal-oxide semiconductor layer 206b, a first source electrode 110a that is in contact with the p-type metal-oxide semiconductor layer 206a, a second source electrode 110b that is in contact with the n-type metal-oxide semiconductor layer 206b, and a shared drain electrode 112 electrically connecting the p-type metal-oxide semiconductor layer 206a and the n-type metal-oxide semiconductor layer 206b.

The semiconductor circuit (200, 1900) may include a further interlayer dielectric layer partially surrounding the gate electrode 116 (e.g., see FIGS. 2A, 2B, and 2C). The semiconductor circuit (200, 1900) may further include a first gate dielectric layer 118a disposed between the p-type metal-oxide semiconductor layer 206a and the gate electrode 116, and a second gate dielectric layer 118b disposed between the gate electrode 116 and the n-type metal-oxide semiconductor layer 206b.

According to various embodiments, the first gate dielectric layer 118a and the second gate dielectric layer 118b may include one or more of silicon oxide, aluminum oxide, hafnium oxide, hafnium lanthanum oxide, hafnium silicon oxide, hafnium tantalum oxide, hafnium titanium oxide, hafnium zirconium oxide, zirconium oxide, titanium oxide, tantalum oxide, and hafnium dioxide-alumina. Further, in some embodiments, the n-type metal-oxide semiconductor layer 206b may include one or more of amorphous silicon, $Al_2O_5Zn_2$ doped ZnO, InGaZnO, InGaO, InWO, InZnO, InSnO, $Ga_2O_3$, ZnO, GaO, InO, $In_2O_3$, InZnO, ZnO, TiOx, and alloys thereof; the p-type metal-oxide semiconductor layer 206a may include one or more of NiO, SnO, and $Cu_2O$; and one or more of the first source electrode 110a, the second source electrode 110b, and the shared drain electrode 112 may include one or more of TiN, W, WN, WCN, Co, PdCo, Mo, Cu, TaN, Ti, Al, and alloys of one or more of W, Mo, Co, Pd, Ti, and mixtures thereof, with or without N and/or O.

The above-described embodiments provide semiconductor circuits (200, 200c) and methods that may be advantageous in terms of manufacturing flexibility, reduced size, and reduced short channel effects. In this regard, an embodiment semiconductor circuit (e.g., a CMOS inverter (200, 200c, 1900)) is provided that may be formed in a BEOL process and may be incorporated with other BEOL circuit components such as capacitors, inductors, resistors, and integrated passive devices. As such, the disclosed semiconductor circuit (200, 200c, 1900) may include materials that may be processed at low temperatures and thus, may not damage previously fabricated devices (e.g., FEOL and MEOL devices). Further, various embodiment semiconductor circuits (200, 900) may include a first-conductivity-type semiconductor layer 206a disposed over an interlayer dielectric layer (136, 138, 140, 150, 302, 304a to 304f), a gate electrode 116 disposed over the first-conductivity-type semiconductor layer 206a, and a second-conductivity-type semiconductor layer 206b disposed over the gate electrode 116 in a vertically stacked configuration (e.g., see FIGS. 2A, 2B, and 2D) that may provide a semiconductor circuit (200, 200c, 1900) having a reduced size relative to alternative structures that do not include such a vertically stacked configuration. The embodiment semiconductor circuits (200, 200c, 1900) may allow longer channel lengths without increased device size, which may mitigate short-channel effects.

The foregoing outlines features of several embodiments so that those skilled in the art may better understand the aspects of this disclosure. Those skilled in the art should appreciate that they may readily use this disclosure as a basis for designing or modifying other processes and structures for carrying out the same purposes and/or achieving the same advantages of the embodiments introduced herein. Those skilled in the art should also realize that such equivalent constructions do not depart from the spirit and scope of this disclosure, and that they may make various changes, substitutions, and alterations herein without departing from the spirit and scope of this disclosure.

What is claimed is:

1. An inverter circuit, comprising:
a first-conductivity-type semiconductor layer disposed over an interlayer dielectric layer;
a gate electrode disposed over the first-conductivity-type semiconductor layer;
a second-conductivity-type semiconductor layer disposed over the gate electrode;
a first gate dielectric layer disposed between the first-conductivity-type semiconductor layer and the gate electrode;
a second gate dielectric layer disposed between the gate electrode and the second-conductivity-type semiconductor layer;
a first source electrode that is in contact with the first-conductivity-type semiconductor layer;
a second source electrode that is in contact with the second-conductivity-type semiconductor layer; and
a shared drain electrode that is in contact with the first-conductivity-type semiconductor layer and the second-conductivity-type semiconductor layer.

2. The inverter circuit of claim 1, wherein:
the interlayer dielectric layer comprises a horizontal interface;
the gate electrode comprises a first surface that is adjacent to the first-conductivity-type semiconductor layer and is parallel to the horizontal interface of the interlayer dielectric layer;
the gate electrode comprises a second surface that is adjacent to the second-conductivity-type semiconductor layer and is also parallel to the horizontal interface of the interlayer dielectric layer;
the first-conductivity-type semiconductor layer comprises a first channel layer disposed along a first horizontal plane that is adjacent to the first surface of the gate electrode; and
the second-conductivity-type semiconductor layer comprises a second channel layer disposed along a second horizontal plane that is adjacent to the second surface of the gate electrode.

3. The inverter circuit of claim 1, wherein:
the first-conductivity-type semiconductor layer is a p-type semiconductor layer and the second-conductivity-type semiconductor layer is an n-type semiconductor layer;
the first source electrode is electrically connected to a voltage supply and the second source electrode is electrically connected to a ground voltage terminal;
the gate electrode is electrically connected to an input signal terminal; and
the shared drain electrode is electrically connected to an output signal terminal.

4. The inverter circuit of claim 3, wherein at least one of the p-type semiconductor layer and the n-type semiconductor layer comprise metal-oxide semiconductors.

5. The inverter circuit of claim 3, wherein at least one of the n-type semiconductor layer and the p-type semiconductor layer comprises a metal-oxide semiconductor comprising a multi-layer structure.

6. The inverter circuit of claim 3, wherein the n-type semiconductor layer comprises an alloy comprising, oxygen, a group-III element, and a group-V element.

7. The inverter circuit of claim 3, wherein the n-type semiconductor layer comprises one or more of amorphous silicon, $Al_2O_5Zn_2$ doped ZnO, InGaZnO, InGaO, InWO, InZnO, InSnO, $Ga_2O_3$, ZnO, GaO, InO, $In_2O_3$, InZnO, ZnO, TiOx, and alloys thereof.

8. The inverter circuit of claim 3, wherein the n-type semiconductor layer comprises a composition given by $In_x$ $Ga_y Zn_z$ MO, wherein $0<x<1$; $0\leq y\leq 1$; $0\leq z\leq 1$; and M is one of Ti, Al, Ag, Ce, and Sn.

9. The inverter circuit of claim 3, wherein the p-type semiconductor layer comprises one or more of NiO, SnO, and $Cu_2O$.

10. The inverter circuit of claim 1, wherein the interlayer dielectric layer further comprises one or more electrical interconnect structures, and
wherein one or more of the first source electrode, the second source electrode, the shared drain electrode, and the gate electrode are electrically connected to the one or more electrical interconnect structures.

11. The inverter circuit of claim 1, wherein one or more of the first gate dielectric layer and the second gate dielectric layer comprises one or more of silicon oxide, aluminum oxide, hafnium oxide, hafnium lanthanum oxide, hafnium silicon oxide, hafnium tantalum oxide, hafnium titanium oxide, hafnium zirconium oxide, zirconium oxide, titanium oxide, tantalum oxide, and hafnium dioxide-alumina.

12. The inverter circuit of claim 1, further comprising a further interlayer dielectric layer partially surrounding the gate electrode.

13. The inverter circuit of claim 1, wherein one or more of the first source electrode, the second source electrode, and the shared drain electrode comprise one or more of TiN, W, WN, WCN, Co, PdCo, Mo, Cu, TaN, Ti, and Al.

14. The inverter circuit of claim 1, wherein one or more of the first source electrode, the second source electrode, and the shared drain electrode further comprise one or more alloys of one or more of W, Mo, Co, Pd, Ti, and mixtures thereof, with or without N and/or O, deposited by chemical vapor deposition or by atomic layer deposition.

15. A semiconductor circuit, comprising:
a p-type metal-oxide semiconductor layer disposed within an interlayer dielectric layer such that the p-type metal-oxide semiconductor layer is parallel to a horizontal interface of the interlayer dielectric layer;
an n-type metal-oxide semiconductor layer disposed within the interlayer dielectric layer such that the n-type metal-oxide semiconductor layer is parallel to the p-type metal-oxide semiconductor layer;
a gate electrode disposed within the interlayer dielectric layer such that the gate electrode is disposed between the p-type metal-oxide semiconductor layer and the n-type metal-oxide semiconductor layer;
a first source electrode that is in contact with the p-type metal-oxide semiconductor layer;
a second source electrode that is in contact with the n-type metal-oxide semiconductor layer; and
a shared drain electrode electrically connecting the p-type metal-oxide semiconductor layer and the n-type metal-oxide semiconductor layer.

16. The semiconductor circuit of claim 15, further comprising:
a further interlayer dielectric layer partially surrounding the gate electrode;
a first gate dielectric layer disposed between the p-type metal-oxide semiconductor layer and the gate electrode; and
a second gate dielectric layer disposed between the gate electrode and the n-type metal-oxide semiconductor layer, wherein the first gate dielectric layer and the second gate dielectric layer comprise one or more of silicon oxide, aluminum oxide, hafnium oxide, hafnium lanthanum oxide, hafnium silicon oxide, hafnium tantalum oxide, hafnium titanium oxide, hafnium zirconium oxide, zirconium oxide, titanium oxide, tantalum oxide, and hafnium dioxide-alumina.

17. The semiconductor circuit of claim 15, wherein the n-type metal-oxide semiconductor layer comprises one or more of amorphous silicon, $Al_2O_5Zn_2$ doped ZnO, InGaZnO, InGaO, InWO, InZnO, InSnO, $Ga_2O_3$, ZnO, GaO, InO, $In_2O_3$, InZnO, ZnO, TiOx, and alloys thereof, wherein the p-type metal-oxide semiconductor layer comprises one or more of NiO, SnO, and $Cu_2O$, and wherein one or more of the first source electrode, the second source electrode, and the shared drain electrode comprise one or more of TiN, W, WN, WCN, Co, PdCo, Mo, Cu, TaN, Ti, Al, and alloys of one or more of W, Mo, Co, Pd, Ti, and mixtures thereof, with or without N and/or O.

18. A method of forming a semiconductor circuit, comprising:

forming a first-conductivity-type semiconductor layer over an interlayer dielectric layer;

forming a first source electrode in electrical contact with the first-conductivity-type semiconductor layer;

forming a first gate dielectric layer over the first-conductivity-type semiconductor layer;

forming a gate electrode over the first gate dielectric layer;

forming a second gate dielectric layer over the gate electrode;

forming a second-conductivity-type semiconductor layer over the second gate dielectric layer;

forming a second source electrode in electrical contact with the second-conductivity-type semiconductor layer; and forming a shared drain electrode in electrical contact with the first-conductivity-type semiconductor layer and the second-conductivity-type semiconductor layer.

19. The method of claim 18, further comprising configuring the semiconductor circuit as an inverter circuit by performing operations comprising:

electrically connecting the first source electrode to a voltage supply and the second source electrode to a ground voltage terminal;

electrically connecting the gate electrode to an input signal terminal; and electrically connecting the shared drain electrode to an output signal terminal.

20. The method of claim 18, further comprising:

forming one of the first-conductivity-type semiconductor layer and the second-conductivity-type semiconductor layer to comprise an n-type semiconductor layer comprising at least one of amorphous silicon, $Al_2O_5Zn_2$ doped ZnO, InGaZnO, InGaO, InWO, InZnO, InSnO, $Ga_2O_3$, ZnO, GaO, InO, $In_2O_3$, InZnO, ZnO, TiOx, and alloys thereof;

forming the other of the first-conductivity-type semiconductor layer and the second-conductivity-type semiconductor layer to comprise a p-type semiconductor layer comprising at least one of NiO, SnO, and $Cu_2O$;

forming one or more of the first gate dielectric layer and the second gate dielectric layer to comprise at least one of silicon oxide, aluminum oxide, hafnium oxide, hafnium lanthanum oxide, hafnium silicon oxide, hafnium tantalum oxide, hafnium titanium oxide, hafnium zirconium oxide, zirconium oxide, titanium oxide, tantalum oxide, and hafnium dioxide-alumina;

forming one or more of the first source electrode, the second source electrode, and the shared drain electrode to comprise one or more of TiN, W, WN, WCN, Co, PdCo, Mo, Cu, TaN, Ti, and Al; and forming a further interlayer dielectric layer that partially surrounds the gate electrode.

* * * * *